US005650644A

United States Patent [19]
Funakoshi et al.

[11] Patent Number: 5,650,644
[45] Date of Patent: Jul. 22, 1997

[54] CHARGE TRANSFER DEVICE HAVING A PLURALITY OF VERTICAL AND HORIZONTAL CHARGE-COUPLED DEVICES WITH IMPROVED CONFIGURATIONS FOR ISOLATION REGIONS AND IMPURITY IMPLANTED REGIONS BETWEEN THE CHARGE-COUPLED DEVICES

[75] Inventors: Hiromasa Funakoshi, Hirakata; Takao Kuroda, Ibaraki, both of Japan

[73] Assignee: Matsushita Electric Industrial Co., Ltd., Kadoma, Japan

[21] Appl. No.: 301,439

[22] Filed: Sep. 9, 1994

Related U.S. Application Data

[63] Continuation of Ser. No. 68,613, May 27, 1993, abandoned, which is a continuation of Ser. No. 699,613, May 15, 1991, abandoned.

[30] Foreign Application Priority Data

May 16, 1990 [JP] Japan ................................. 2-127281
Feb. 12, 1991 [JP] Japan ................................. 3-018583

[51] Int. Cl.[6] ............................................ H01L 27/148
[52] U.S. Cl. .......................... 257/240; 257/241; 257/243; 257/250
[58] Field of Search ................................. 357/24, 24 M, 357/24 LR; 257/240, 241, 243, 247, 250

[56] References Cited

U.S. PATENT DOCUMENTS

| | | | |
|---|---|---|---|
| 4,965,648 | 10/1990 | Yang et al. | 357/24 M |
| 4,987,466 | 1/1991 | Shibata et al. | 357/24 LR |
| 5,040,071 | 8/1991 | Stevens | 357/24 LR |
| 5,093,849 | 3/1992 | Goto | 357/24 M |
| 5,164,807 | 11/1992 | Thenwissen | 257/241 |

FOREIGN PATENT DOCUMENTS

| | | | |
|---|---|---|---|
| 60-189966 | 9/1985 | Japan . | |
| 62-104077 | 5/1987 | Japan | 357/24 |

OTHER PUBLICATIONS

E. Oda et al; "½ Inch 768(H)X492(V) Pixel CCD Image Sensor",. IEDM 85, pp. 444–447; 1985 IEEE.

*Primary Examiner*—Ngân V. Ngô
*Attorney, Agent, or Firm*—Cushman, Darby & Cushman IP Group of Pillsbury Madison & Sutro LLP

[57] ABSTRACT

A charge transfer device has trapezoidal shape impurity-implanted regions (1, 51, . . . ) in n-type regions (271, 371) at least in the through-paths between a first HCCD (27) and a second HCCD (28), and its isolation regions (41) under the transfer gate (29) are trapezoidal shaped, and thereby charge transfer loss and hence FPN is minimized and the transfer efficiency is much improved.

6 Claims, 21 Drawing Sheets

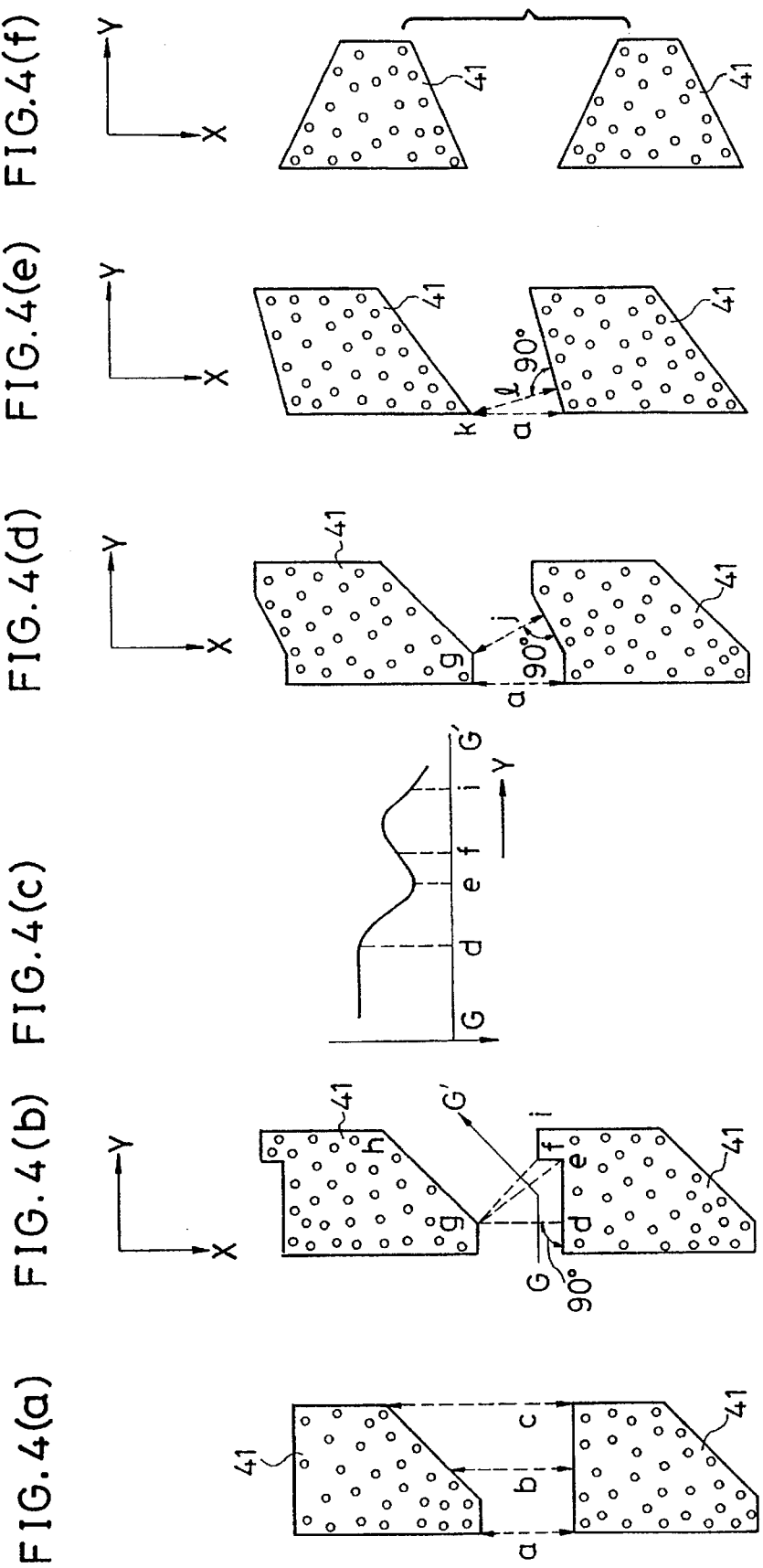

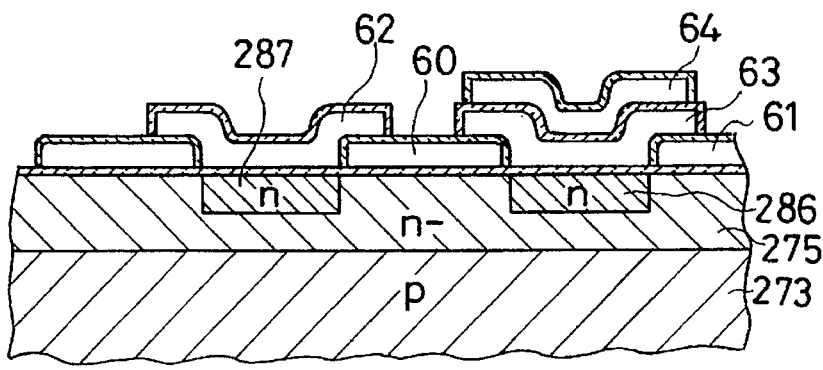
FIG.5(i)
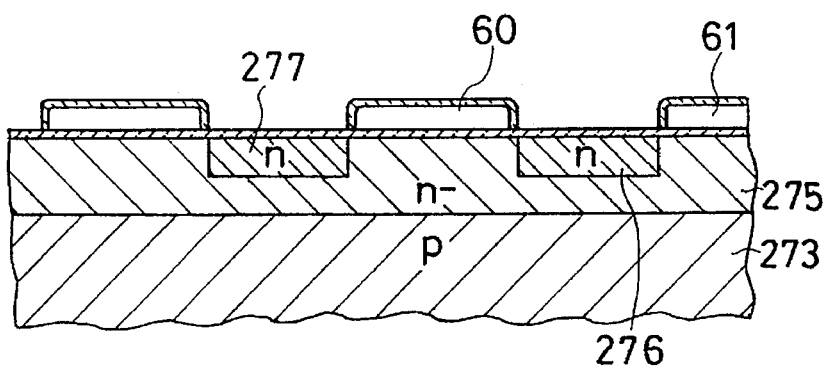
FIG.5(j)
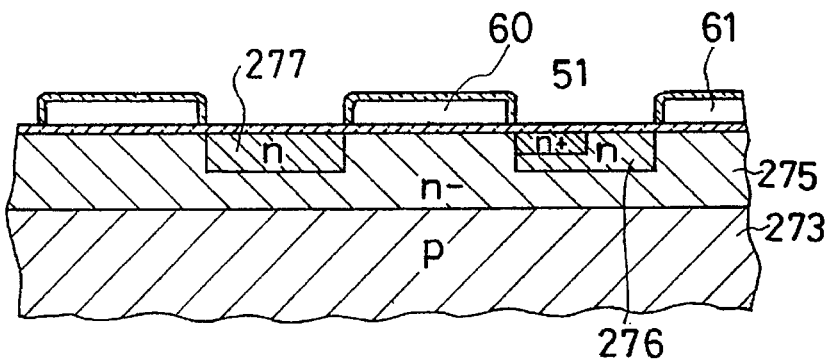
FIG.5(k)
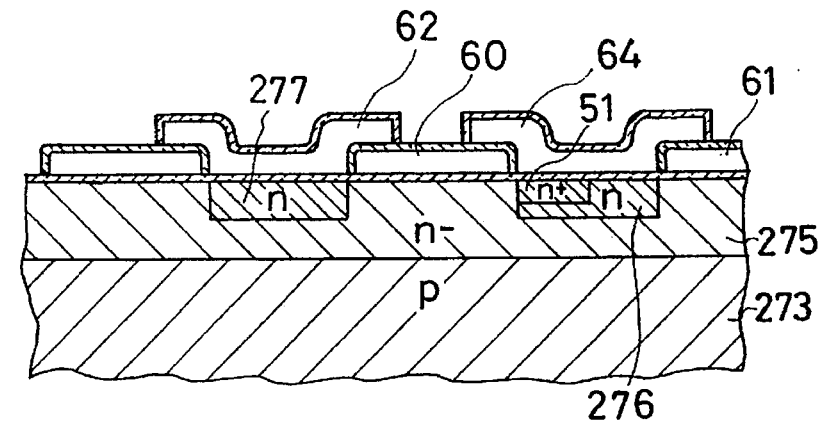
FIG.5(ℓ)

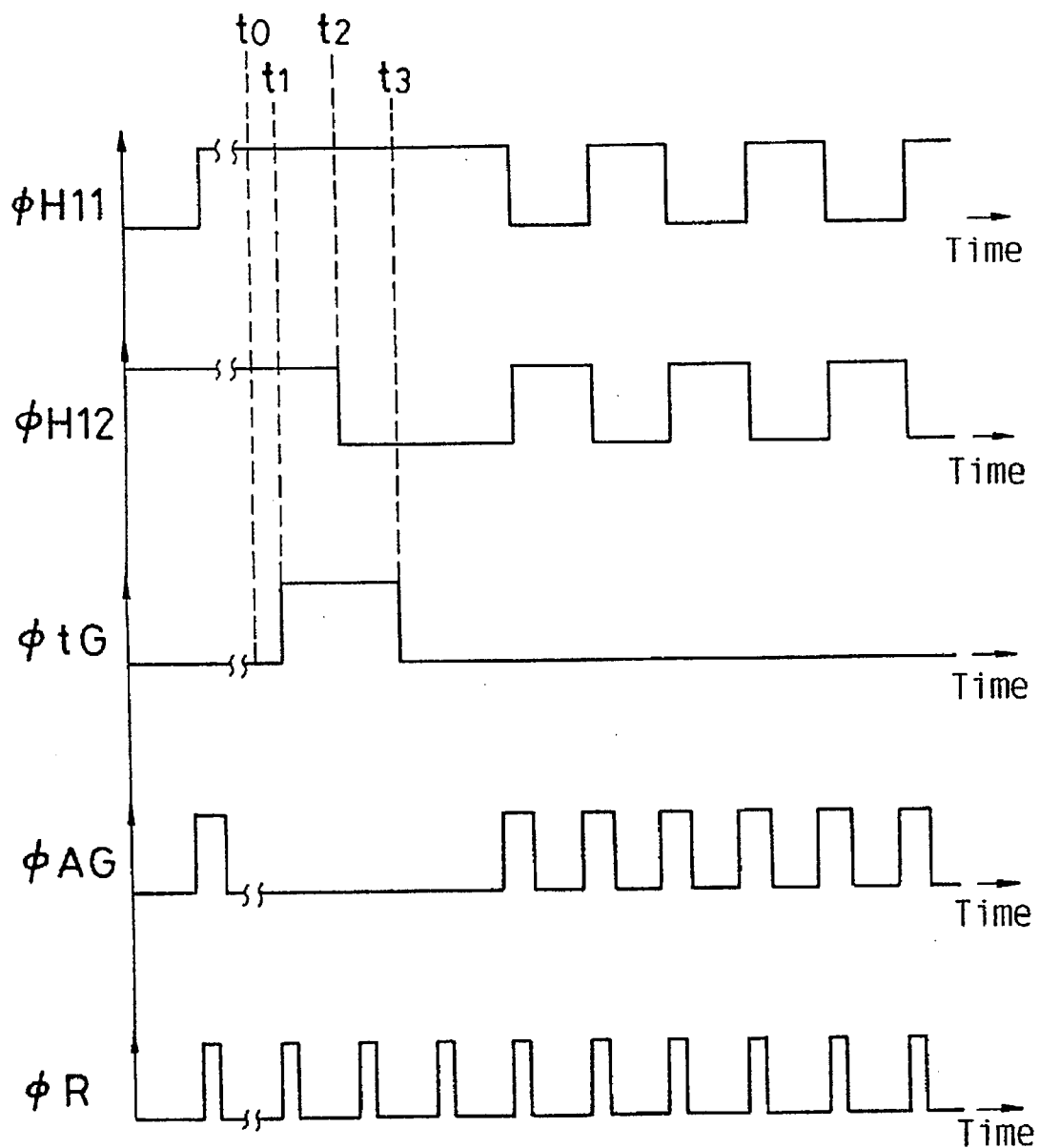

CHARGE TRANSFER DEVICE HAVING A PLURALITY OF VERTICAL AND HORIZONTAL CHARGE-COUPLED DEVICES WITH IMPROVED CONFIGURATIONS FOR ISOLATION REGIONS AND IMPURITY IMPLANTED REGIONS BETWEEN THE CHARGE-COUPLED DEVICES

This application is a continuation of application Ser. No. 08/068,613 filed May 27, 1993, now abandoned, which is a continuation of application Ser. No. 07/699,613 filed May 15, 1991, now abandoned.

BACKGROUND OF THE INVENTION

1. Field of the Invention

The present invention relates to a charge transfer device, and more particularly to a charge coupled device (hereinafter is referred to as CCD).

2. Description of the Related Art

The charge transfer device, in particular the CCD has many technical advantages such as having rather small size and simple configuration; and therefore, intensive research and development thereon are being made. Furthermore in recent years, because high quality reproduced picture is demanded, an increase in transfer frequency of CCD devices is further demanded. In conventional CCDs', plural horizontal CCDs' are provided such that transfer frequencies are halved in order to prevent complication circuit design and increased power consumption. Such conventional art is disclosed, for instance, in the gazette of the Japanese published unexamined patent application Sho 60-189966 (Tokkai Sho 60-189966). The art alleges the advantage that the frequency of a transfer signal is halved, the density of integration of a horizontal CCD is halved and the power consumption is low.

FIG. 10(a) shows a plan-view configuration of a portion of a prior art horizontal CCD apparatus in Tokkai Sho 60-189966. FIG. 10(b) is an overall circuit block diagram of a general CCD apparatus which includes the horizontal CCD apparatus of FIG. 10(a), wherein a float diffusion layer (FD) region 30 is provided at the lower end of the HCCDs' 27 and 28. Vertical CCDs' (hereinafter are referred to as VCCDs') 31, ..., 31 are connected vertically to the EICCDs' 27. The device of FIG. 10(a) has a pair of horizontal CCD (hereinafter referred to HCCD) 27 and 28 with a transfer gate 29 therebetween. HCCDs' 27 and 28 are connected through horizontal gates 25 and 26 to common floating diffusion layer (hereinafter is referred to as FD) 30. The horizontal gates 21, 22, 23 and 24 constitute a two-phase driving CCD, and charges are temporarily stored underneath the wider horizontal gates 22 and 24 and transferred stepwise in X-direction therebetween. The horizontal gates 25 and 26 operate as a two-phase driving CCD similarly to the horizontal gates 21, 22, 23 and 24. Transfer gate 29 is formed by a first polysilicon layer, the horizontal gates 22 and 24 are formed by a second polysilicon layer formed thereafter and the horizontal gates 21 and 23 are formed by a third polysilicon layer formed further thereafter. Reset signal ⌀R is applied to the reset gate 35. At a point of time T=t0, charge transfer from a vertical CCD (not shown) to HCCD 27 is over. At and after a time point t1, the signal ⌀tG applied to transfer gate 29 is ON, and the charges in through-channel A Or FIG. 10(a) is transferred through transfer gate 29 to HCCD 28. At that time, charges in interrupted-channel B remain in parts in HCCD 27, obstructed by isolation region 40. Isolation regions 40 are made by ion implantation or by thick insulation regions. At time point T2 when the signal ⌀H12 turns OFF, the charges in through-channel A of the HCCD 27 are all transferred through portions under transfer gate 29 to portions of HCCD 28. Furthermore, since the signal ⌀H11 is ON at that point in time, the charge in the B region remains still under horizontal gate 22 in the HCCD 27. At a time point t3 when the signal ⌀VG turns OFF, the charges under transfer gate 29 are all transferred to portions under horizontal gate 22 in HCCD 28.

In the above-mentioned manner, the charge transfer is made either to the HCCD 27 or to the HCCD 28.

The operation of the conventional CCD device in FIG. 10(a) is as follows:

When a signal charge is transferred as shown by arrows 31, 31, ... to portions underneath horizontal gates 22 and 24, this charge is transferred, by the operation of transfer gate 29, to portions underneath horizontal gate 22 in HCCD 28. Regions 40, 40, and 38 are isolation regions, and are formed by impurity diffused channel stoppers or thick oxide films. From terminals 32 and 33, horizontal transfer pulse signal ⌀H11 is applied to horizontal gates 21 and 22, and also horizontal transfer pulse signal ⌀H12 is applied to horizontal gates 23 and 24, respectively. And thereafter, the charges are transferred through HCCDs' 27 and 28 and led, through combining gates 25 and 26, to output gate 34, and finally transferred to the FD 30.

FIG. 11 is a time chart showing operation signals of the apparatus of FIG. 10(a). Signal ⌀tG is applied to the transfer gate 29. Signal ⌀AG is applied to the combining gates 25 and 26 through a terminal 39. And after dividedly being transferred to the two HCCDs' 27 and 28, the charges in the HCCD 27 and in the HCCD 28 are alternatively transferred towards the FD 30 by means of signals ⌀H12 and ⌀H11. Thus the frequencies of the transfer driving signals ⌀H12 and ⌀H11 are halved in comparison with older constructions using a non-divided HCCD.

However, the prior art device shown in FIG. 10(a) and FIG. 11 has the following problems:

FIG. 12(a), FIG. 12(b) and FIG. 12(c) show potential distribution in this prior art device. As shown in FIG. 13(a) and (b), the pitches of a gate configuration in the x-direction become short as the degree of integration increases; and in general, a narrow-channel effect, which makes the potential low, appears when the gaps between gates becomes short. The case of a narrow-channel effect appearing in the prior art is elucidated.

Because of problems with the manufacturing process, a gate has microscopic irregularity, and hence gaps between gates can have delicate variations. Potential distribution in the Y-direction is influenced by a narrow-channel effect such that the potential becomes higher and lower as the gate gaps become wider and narrower, respectively. As a result, potential irregularity is produced in the Y-direction depending on the variation of gate gaps. Hence the transfer loss shown as hatched through-channel A in FIG. 12(a) is produced when the charge is transferred from HCCD 27 to HCCD 28. Defining the amount of the transfer loss as α, a next stage of HCCD 27 is added by the amount α to the actual charge, and the actual charge transferred to the HCCD 28 is less by the amount α from the ideal amount. Such amount α results in FPN (fixed pattern noise) to deteriorate the picture quality. Such FPN is produced not only by the irregularity of HCCD 27, but may be produced also, as shown by FIG. 12(b) when the gap γ between the isolation regions in the transfer gate 29 is narrower than the width W (in the X-direction) of HCCD 27, or as shown by FIG. 12(c) when the potential recess is formed in the transfer direction X of the HCCD 27 and 28. In such cases, as shown in FIG. 12(c), a raised part B of potential is formed, and therefore the charge transfer from the HCCD 27 to the transfer gate 29 is not made sufficiently.

Even when both opposing sides along an isolation gap are formed quite parallelly, if the parallel sides are extending very long, an irregularity along the parallel sides will form. Or alternatively, the charges sometimes are not transferred completely, making reverse flow at the last part or beyond midway part of the transfer, thereby resulting in transfer loss similar to the partition noise.

As has been elucidated, the CCD device of the conventional configuration has the problem of providing considerable deterioration of picture quality due to FPN and the like, which are caused by charge transfer losses generated at various parts, and induced by narrow-channel effects due to the high degree of integration. Hitherto, severe and difficult measures have been taken not to produce such narrow-channel effects, in the technologies of designing and manufacturing process. However, when a higher degree of integration is demanded, a narrow channel effect becomes an essential problem to be overcome rather than one to be avoided or averted.

With regard to isolation region 40, another problem of this prior art device is elucidated with reference to FIG. 13(a) and (b) showing plan views of the pertinent portion of the device. Generally isolation region 40 is formed by ion-implantation of p-conductivity type atoms. However, even though the isolation region 40 is formed rectangular or square as shown in FIG. 13(a), the actually formed isolation region is diffused to the region shown by the broken lines. This is mainly due to thermal diffusion during heat treatment steps, and thermal diffusion is not easily controllable, hence, thermal diffusion cannot be avoided. When an external voltage applied to the CCD is zero, the potential is as shown in FIG. 13(b), wherein the chain lines show equipotential lines and the batched parts show regions of potentials above the equipotential. In a conventional device, the equipotential lines along the transfer gate 29 are not straight, but gently meander. Therefore, when the actual isolation region 40 diffuses considerably outside the designed regions 40, 40, . . . , thereby to form the meandering equi-potential lines as shown in FIG. 13 (b), the virtual or effective regions of HCCD's 27 and 28 are not straight rectangles but irregularly formed, thereby lowering the transfer efficiency in the direction towards FD30.

SUMMARY OF THE INVENTION

The present invention purposes to solve the above-mentioned problems of the prior art and to provide an improved charge transfer apparatus having excellent transfer speed, transfer efficiency and low fixed pattern noise.

In order to achieve the above-mentioned object, the charge transfer device of the present invention comprises:
  plural horizontal charge coupled devices disposed in parallel,
  plural isolation regions disposed in a transfer gate part which is disposed between the plural horizontal charge coupled devices, and
  impurity-implanted regions having at least one side which is oblique to the longitudinal direction of horizontal gates.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 4(a), FIG. 4(b), FIG. 4(d), FIG. 4(e) and FIG. 4(f) are plan views illustrating positional relations of neighboring implanted regions.

FIG. 4(c) is a potential distribution graph of the device of FIG. 4(b).

FIG. 5(i), FIG. 5(J), FIG. 5(k) and FIG. 5(l) are sectional views showing sectional configuration of the device shown in FIG. 5(g) and FIG. 5 (h).

FIG. 11 is the time chart showing the operation signals of the device of FIG. 10(a).

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

Preferred embodiments of the present invention is elucidated in detail with reference to the accompanying drawings of FIG. 1(a) through FIG. 9(d).

Figure 1A:
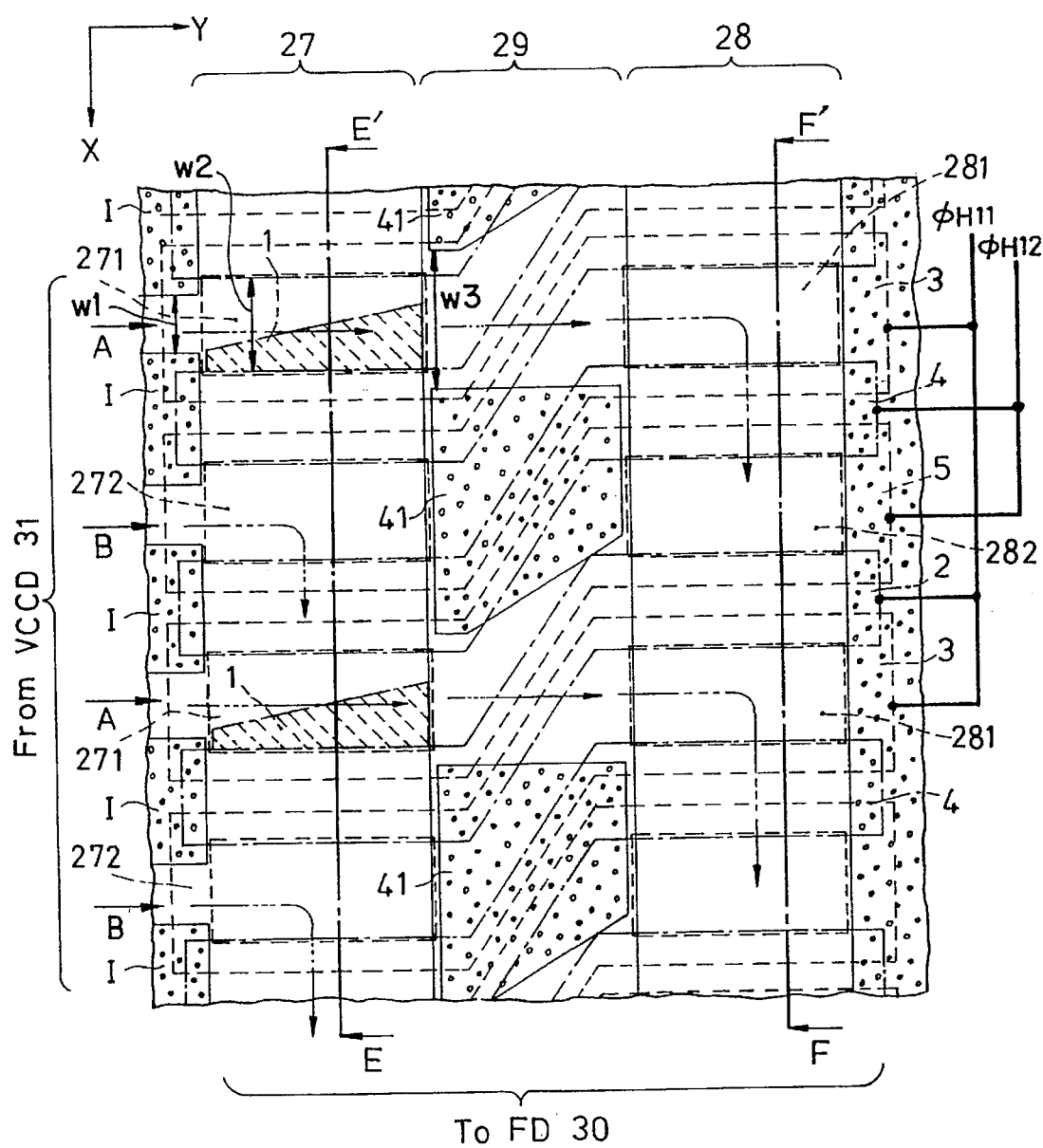
FIG. 1(a) is a plan view showing an essential part of a preferred embodiment of a charge transfer device of the present invention.

FIG. 1(a) is an enlarged plan view showing a part of a first preferred embodiment of a charge transfer device of the present invention.

Figure 1B:
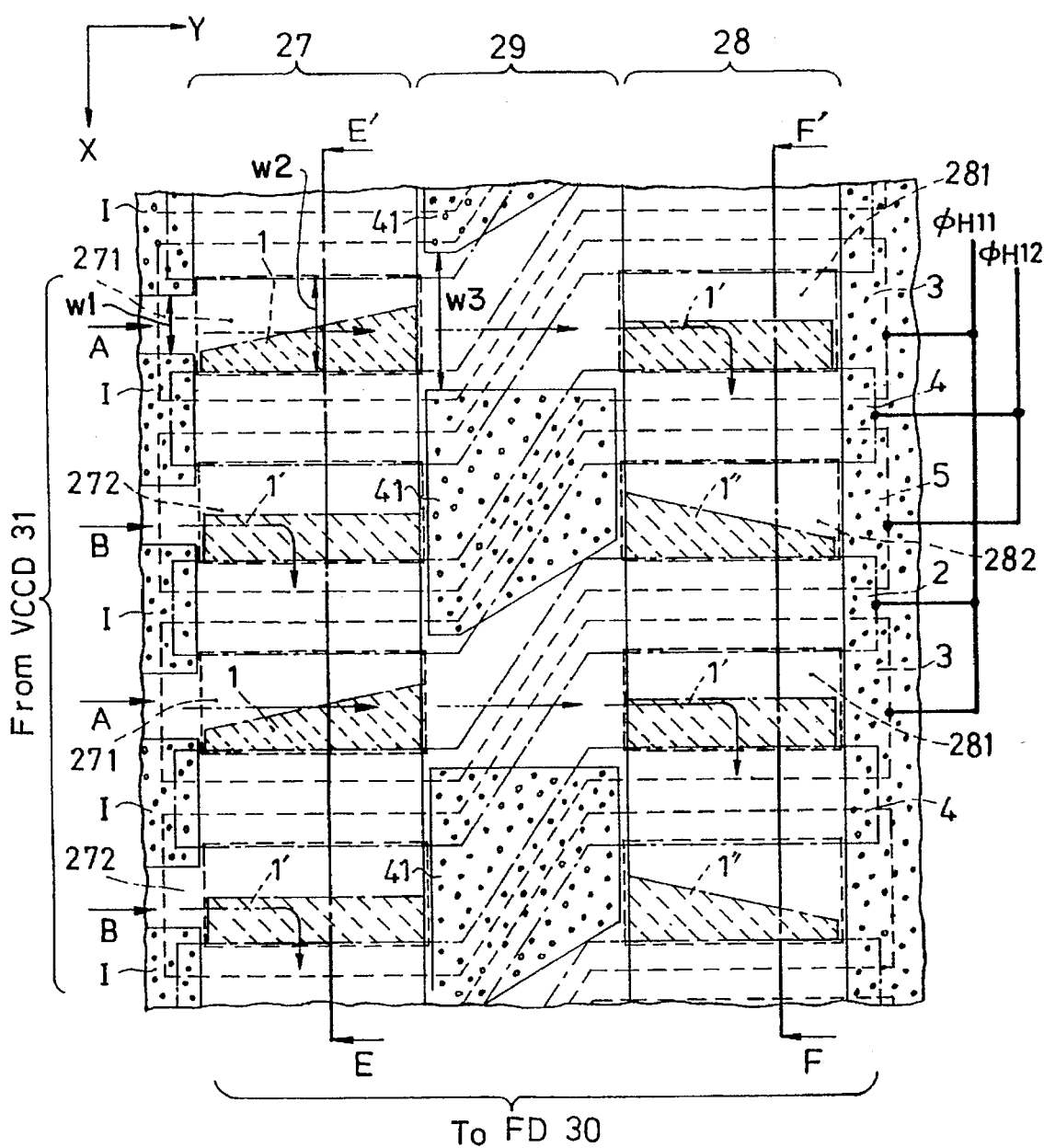
FIG. 1(b) is a plan view showing an essential part of a modified embodiment of the charge transfer device.

FIG. 1(b) is a circuit block diagram of the embodiment of FIG. 1(a).

FIG. 1(c), FIG. 1(d), FIG. 1(e) and FIG. 1(f) are sectional elevation views of the device of FIG. 1(a).

Figure 2B:
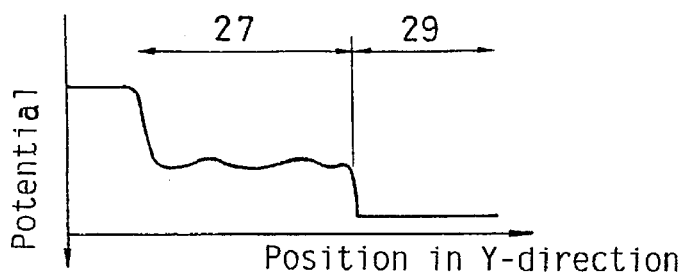
FIG. 2(b), FIG. 2(c) and FIG. 2(d) are potential distribution graphs on the part of the device shown in FIG. 2(a).
Figure 2A:
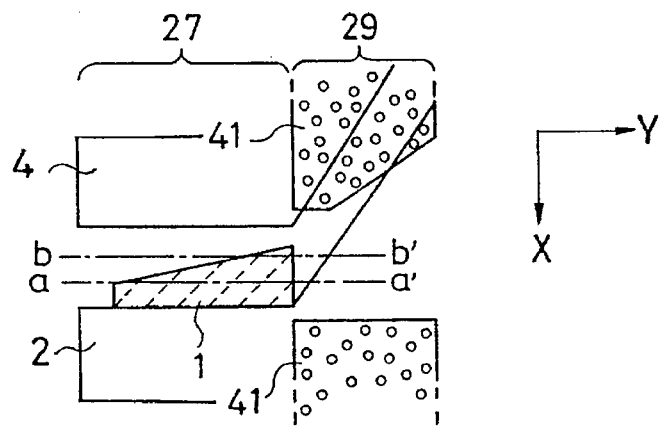
FIG. 2(a) is a partial plan view of the device of FIG. 1(a).

FIG. 2(a) is a partial plan view of the device of FIG. 1(a).

Figure 2C:
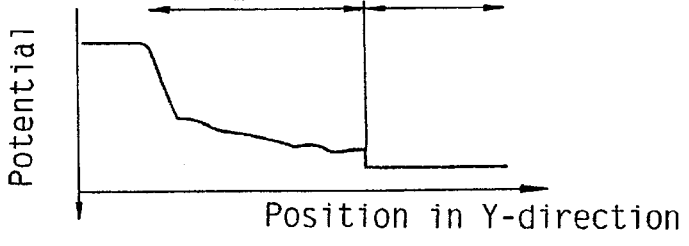
Figure 2D:
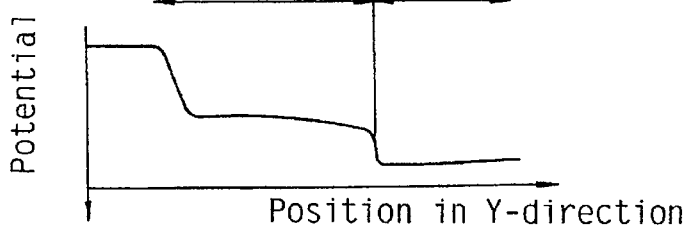

FIG. 2(b), FIG. 2(c) and FIG. 2(d) are potential distribution graphs on the part of the device shown in FIG. 2(a).

The embodiment shown in FIG. 1(a) through FIG. 2(b) is the device for use in a region where a narrow channel effect is likely to appear, and is characterized by providing a deep impurity-implanted region 1 by n+-conductivity impurity atoms, so as to lower the potential of that region in the n-type region 271 in HCCD 27. The impurity-implanted region 1 is shaped in a trapezoid, which has shorter parallel side in the upstream end of a horizontal transfer in the direction from the first HCCD 27 to the second HCCD 28 and longer parallel side in the downstream end (i.e. the end close to the transfer gate 29) of the same HCCD 27. In other words, the width of the impurity-implanted region 1 expands along the horizontal transfer from the left end of the first HCCD 27 towards the second HCCD 28. The deep impurity-implanted region 1 is capacitively connected to overlying horizontal gates 5.

Figure 1C:
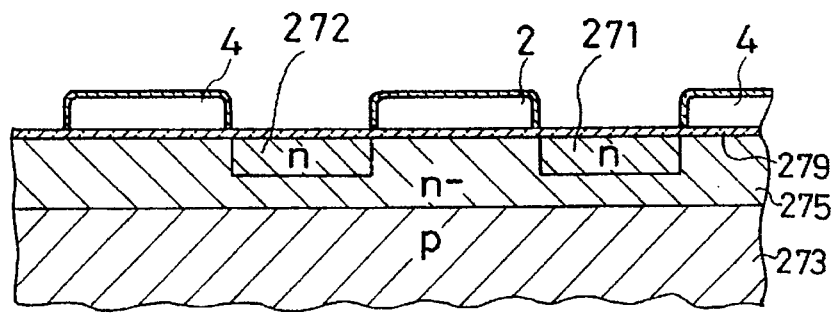
FIG. 1(c), FIG. 1(d), FIG. 1(e) and FIG. 1(f) are sectional elevation views of the device of FIG. 1(a).
Figure 1D:
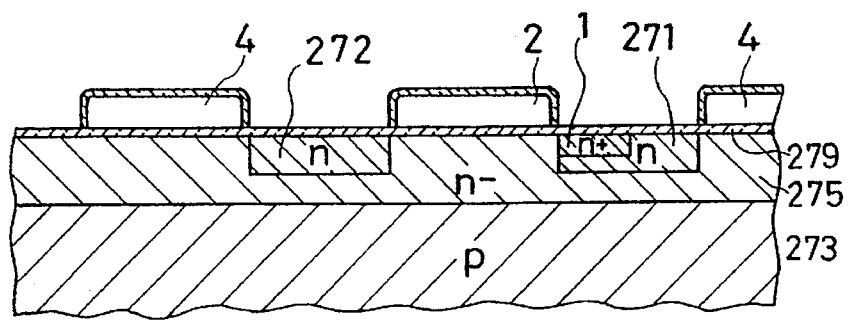
Figure 1E:
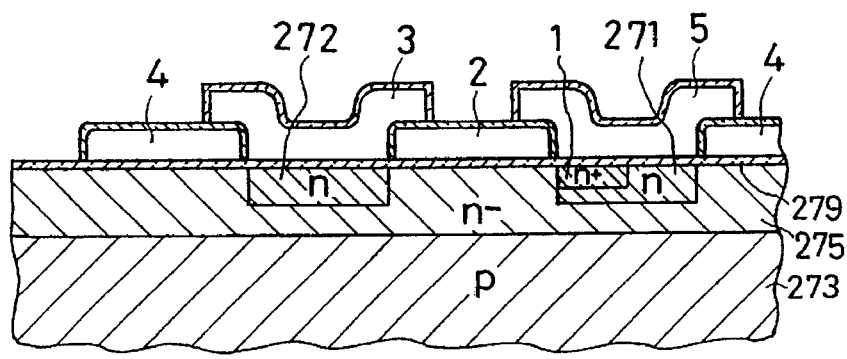

FIG. 1(c) through FIG. 1(e) show sectional configurations at several steps of making in that order of the device at the sectional plane E–E' of FIG. 1(a), and FIG. 1(e) shows the last state wherein the n+-conductivity type impurity-implanted region 1 is formed in the conductivity type region 271, and a horizontal gate 5 is formed thereover above an insulation oxide film 279.

Figure 1F:
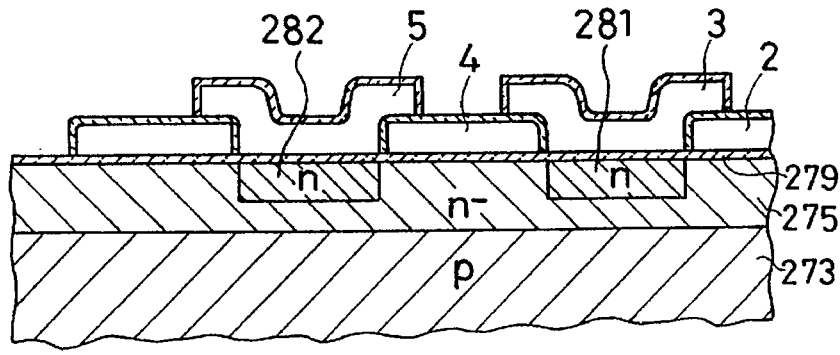

FIG. 1(f) shows a sectional configuration of the device at the sectional plane F–F' of FIG. 1.

As shown in the potential distribution profile of FIG. 2(b), when the transfer of charges in the HCCD 27 nears the finishing stage of the transfer whereat fairly a small amount of charges are left, the charge gathers to the parts of higher potential in the transfer channel.

In this embodiment, n-conductivity type impurity atoms are implanted in the shape to form the impurity-implanted region 1, thereby to form the n+-type region. Therefore, the potential at the impurity-implanted region 1 is raised, and thereby the charge is concentrated thereto.

Furthermore, because of the narrow-channel through-channel appearing in the impurity-implanted region 1, the effective width of region 1 is narrowed, and hence, its potential becomes low. However, it is to be noted that the potential is not lower than the region where the impurity-atoms are not implanted; and hence the broader the region of impurity-implantation is, the higher the potential is. Therefore, potential gradation is produced toward the area underneath the transfer gate 29, and the charge motion in this direction becomes easy. Apart from the prior art shown in FIG. 2(b) having the potential level meandering in the Y-direction, the embodiment of the present invention has a desirable potential gradient in the Y-direction as shown in FIG. 2(c) with respect to the sectional plane a–a' of FIG. 2(a). Therefore, the transfer loss is minimized and transfer speed is increased. In sectional plane b–b', the potential distribution shown in FIG. 2(d) is influenced by impurity-implanted region 1, and therefore, the meandering of the potential level in the Y-direction is reduced and the potential gradation in the X-direction is also produced. Accordingly, even when a small amount of the charge is left at the near-end stage of the charge transferring, the small amount of charge does not remain in the HCCD 27, but is transferred to the part underneath the impurity-implanted region 1, and subsequently to the part below each transfer gate 29 of FIG. 2(a).

Figure 2E:
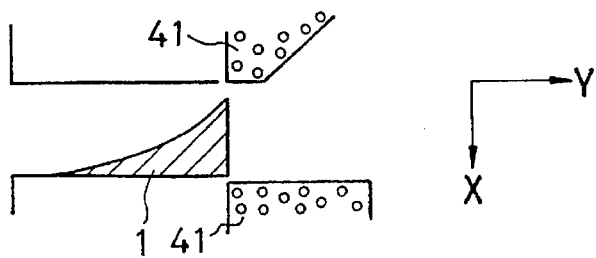
FIG. 2(e) is a partial plan view of a modified device.

Apart from the aforementioned example shown in FIG. 1(a) and FIG. 2(a) wherein the impurity-implanted region 1 is trapezoidal, region 1 may be shaped triangular or parabolic as shown in FIG. 2(e). Insofar as similar shapes are used such that region 1 is shaped in a manner that the depth of region 1 expands from HCCD 27 towards transfer gate 29, a similar technical advantage is obtainable. With regard to the shape of the impurity-implanted region 1 along the direction X, which is the direction of the charge transfer in the HCCD toward FD 30, region 1 is configurated also to continue expansion in the X-direction. That is, the impurity implanted region 1 is not only configured to have the potential gradient from the HCCD 27 toward the transfer gate 29, but also the potential gradient from the charge transfer direction (X-direction) of the HCCD.

In a modified embodiment shown in FIG. 1(b), the impurity implanted region 1' is formed, besides in through-channel A of the HCCD 27, also in through-channel A of the HCCD 28, in order to secure uniformity of the HCCDs.

Similarly, impurity-implanted regions 1' and 1" may be formed in the HCCD 28 of FIG. 1(b). In such cases, since there is no need to transfer the charge to/from the HCCD 27 to HCCD 28, the shape of the impurity-implanted region 1' may be rectangular with longer sides parallel to the longer side edges of horizontal gates 3; instead of trapezoidal as is shown in FIG. 1(b), parabolic shape as in FIG. 2(e), and etc. Furthermore, impurity implanted region 1 in channel A may have a shape such that one part of the respective trapezoid, parabola, triangle etc. contains or is connected to a rectangular shape which is arranged partially parallel, but as a whole expanding along the charge transfer direction Y.

The method of manufacturing the above-mentioned transfer device of the embodiment of FIGS. 1(a) through 2(e) will now be described with reference to FIG. 3(a) through FIG. 3(c), which are sectional views schematically showing steps of manufacturing.

The transfer gate 29 is formed by a first polysilicon layer, which is formed on an insulation layer made on a semiconductor substrate, which has the isolation regions 41, therein. In the prior art of FIG. 10(a) wherein the horizontal gates 24 and 23 are formed by the second polysilicon layer and the third polysilicon layer, respectively. In the present invention the horizontal gates 2 and 4 are formed by the second polysilicon layer, and the horizontal gates 3 and 5 are formed by the third polysilicon layers. The horizontal gates 3 and 2 and the combining gates 26 and 25 (not shown, but having similar function and plan view shape to those of the horizontal gates 26 and 25 of FIG. 10(a)) are formed by the third and the second polysilicon layers, respectively.

Figure 10A:
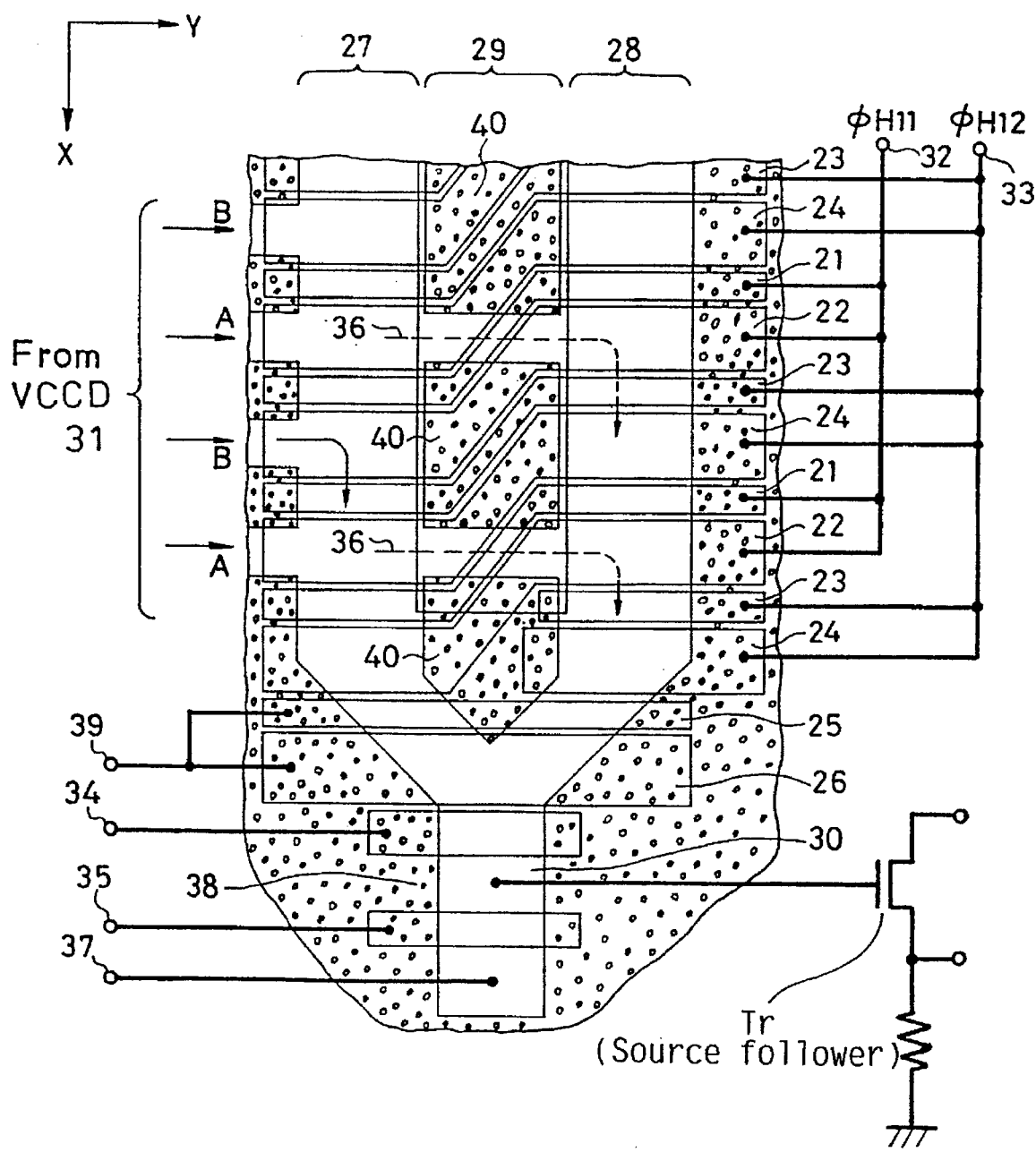
FIG. 10(a) is the enlarged plan view of the essential part of the conventional charge transfer device.
Figure 10B:
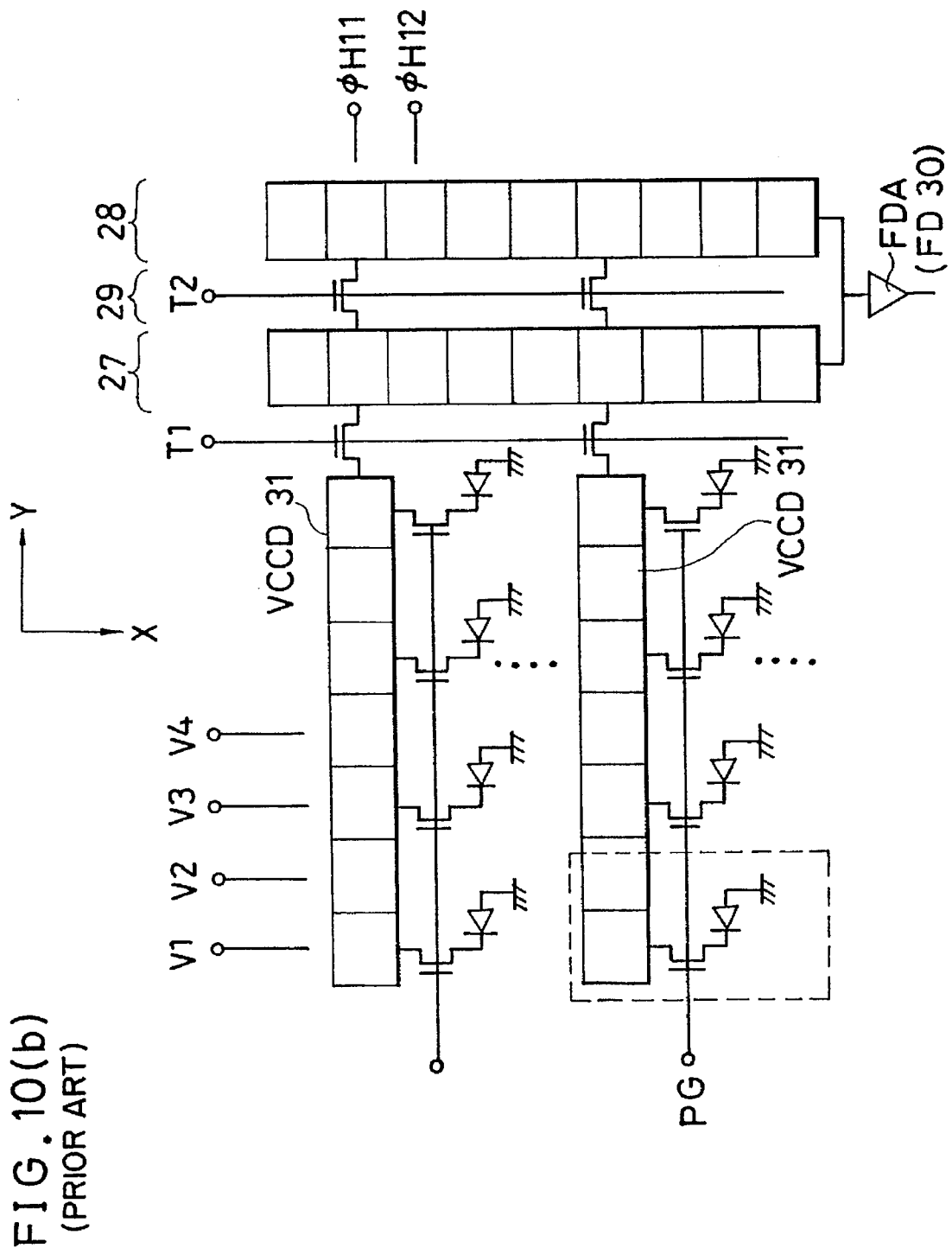
FIG. 10(b) is an overall circuit block diagram of the conventional device of FIG. 10.
Figure 12A:
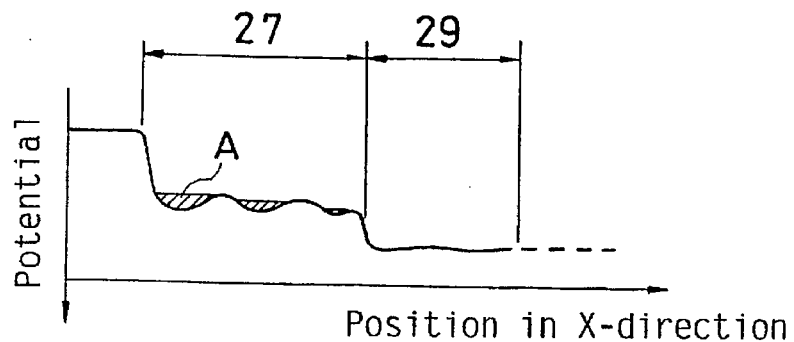
FIG. 12(a) and FIG. 12(c) are the potential distribution curves of the device shown by FIG. 10(a) and FIG. 12(b).
Figure 12B:
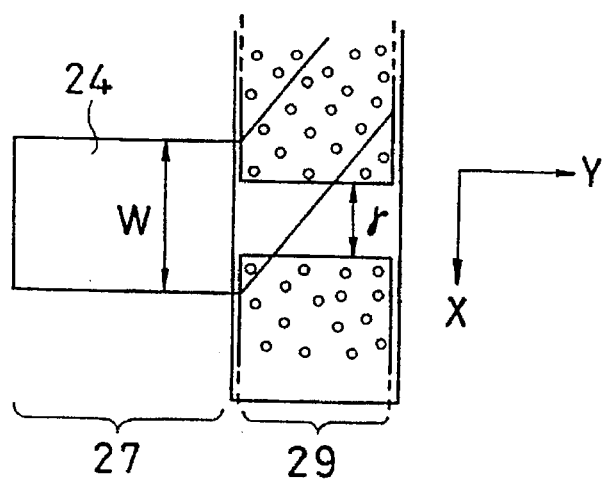
FIG. 12(b) is the plan view of the part of the conventional charge transfer device of FIG. 10(a).
Figure 12C:
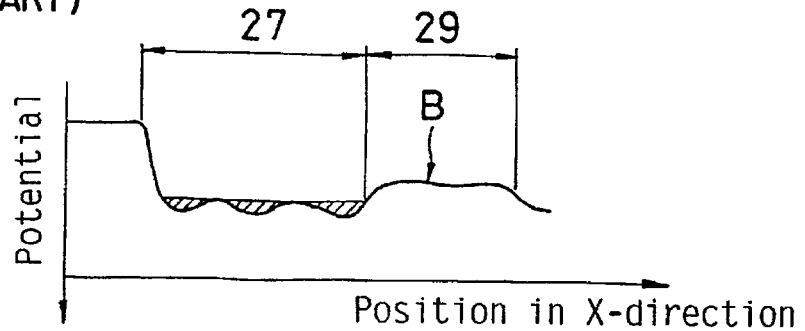

As in the prior art device of FIG. 10(a), the concentrations of p-conductivity impurities under the horizontal gates 3 and 4 are made different from each other so that the potential under the horizontal gate 4 is higher than that under the horizontal gate 3.

In relation to the present invention, after forming horizontal gates 2 and 4 in a predetermined pattern of second polysilicon layer, on an insulation oxide layer 279 which has been already formed on the silicon substrate 273, n-conductivity type impurity atoms are implanted on the whole area of the HCCD, by utilizing these horizontal gates 2 and 4 of second polysilicon layer as an implantation mask. Thereby the potential under the horizontal gates 3 and 5 are raised.

In this implantation, the transfer gate 29 made by the first polysilicon layer and the horizontal gate 3 and 5 made by the second polysilicon layer cooperatively serve as masks. Therefore, the n-conductivity regions 271, 272, 281 and 282 are formed by the impurity implantation only at the regions which later will be underneath the horizontal gates 3 and 5. The impurity implanted region 1 is formed, after forming of the horizontal gates 2 and 4 of second polysilicon layer, by utilizing transfer region 29, second polysilicon layers 2 and 4 and also a later formed photoresist mask as implantation masks in secondary implanting n-conductivity impurity atoms. And thereafter, using a third polysilicon film, horizontal gates 3 and 5 are formed. Furthermore, horizontal gates of 2 and 3, and those of 4 and 5 are respectively connected to each other.

Figure 3A:
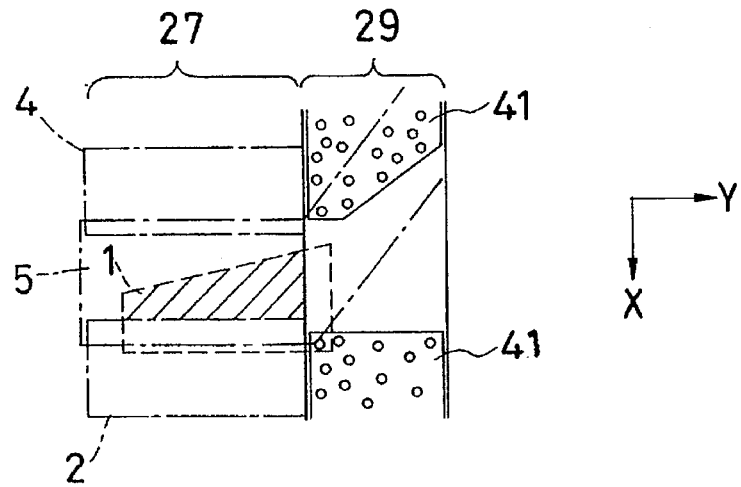
FIG. 3(a), FIG. 3(b) and FIG. 3(c) are plan views showing various malpositionings of an implanted region 1.
Figure 3B:
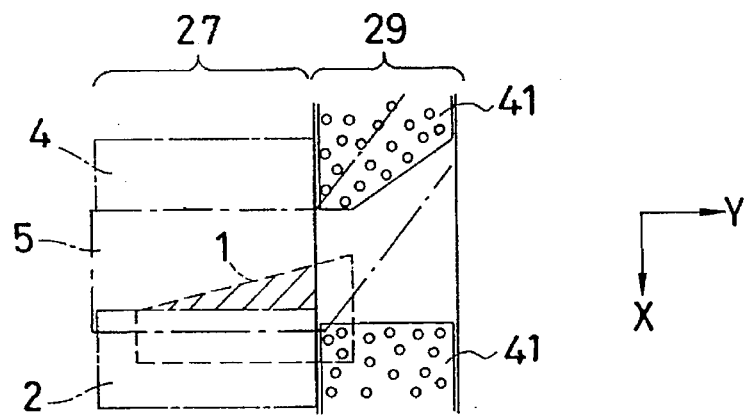
Figure 3C:
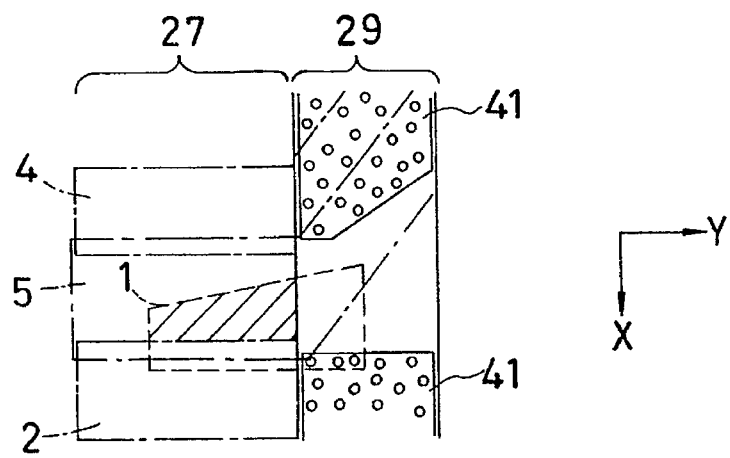

As is apparent from the above-mentioned description and FIG. 3(a), impurity-implanted region 1 is formed by using the first polysilicon layer to produce the transfer gate 29, the second polysilicon layer to produce the horizontal gates 3 and 5 as implantation mask. That is, although the impurity is emitted to the whole of trapezoidal area 1 encircled by the dotted line, the actual implantation of impurity atoms in the conductivity region 271 (of FIG. 1(d)) is limited only to the hatched area.

In the actual manufacturing process of the semiconductor device, misregistration of the mask will be inevitable. And in the present embodiment, there would be a possibility of such misregistrations as shown in FIG. 3(b) or FIG. 3(c). According to the present invention, however, even in the presence of misregistrations, an intended shape such that the impurity-implanted region 1 expands in width along the charge transfer direction (Y), is retained unchanged; and only the shape and area of the non-implanted area underneath the horizontal gate 2 changes.

In this embodiment, by designing the size and shape of the area encircled by the dotted line sufficiently large, the area necessarily overlaps the edges of the horizontal gate 4 and the transfer gate 29. Thereby, even at misregistrations such as shown by FIG. 3(b) and FIG. 3(c), the potential gradient towards the transfer gate 29 is obtainable, and therefore no transfer loss of charge is made.

FIG. 4(a) through FIG. 4(f) show considerations on various types of isolation regions 41, under the transfer gate 29. The preferable types are FIG. 4(a) and FIG. 4(f) which have substantially monotonously expanding gaps. Other types such as FIG. 4(b), FIG. 4(d) and FIG. 4(e) have shortcomings as follows. In the type of FIG. 4(b), the distance between two neighboring isolation regions 41 changes non-monotonously making dint of potential at point e as shown in FIG. 4 (c) .

That is, because the potential is determined by the shortest distance d–g between two opposing edges of the neighboring isolation regions 41, the potential profile along the G–G' sectional plane becomes a non-monotonous curve as shown in FIG. 4(c). The dint point of the potential (at e of FIG. 4(c)) is produced because the distance between two opposing edges of the neighboring isolation regions 41 becomes short at around the f point after making a longer distance at the e point. In case of having such dint part of the potential profile, sufficient charge transfer is not possible.

Similarly, in the cases of the isolation regions of FIG. 4(d) and FIG. 4(e), the potential dints are produced because a>j and a>l, and therefore, insufficient transfers of charges arise.

The characteristic of the isolation region 41 in the transfer gate 29 of the present invention is that one side of the region 41 is arranged parallel with the direction (Y) of the charge transfer from the HCCD 27 to the HCCD 28 and that the other side of the region 41 is arranged obliquely to the above-mentioned one side in a manner that the width (dimension in X-direction) decreases in from the first HCCD 27 to the second HCCD 28. Therefore, a gap between two neighboring isolation regions 41 increases in the direction (Y) of the charge transfer. The example of FIG. 4(a) and FIG. 1(b) has the above-mentioned shape, even though it has a parallel part at the narrowest part (at the starting end of channel which is close to the first HCCD 27), and the shape of the isolation region 41 of FIG. 4(a) has the following relation with regard to the gaps a, b and c at the entrance part of the gap, middle part of the gap and outlet part of the gap, respectively $$a<b<c.$$

And that, the length of the constant-gap or parallel opposing sides part at the most upstream part of the charge transfer of said channel is sufficiently short in comparison with the sides of a monotonously expanding gap.

Accordingly, not only the undesirable meandering of potential arises, but also the transfer speed increases. The modified example of FIG. 4(f) also shows good performance although it is less desirable because the device shown has a higher probability of being influenced by misregistration of its location during manufacturing. Another modified shape of the isolation region may be made by removing the rectangular part from the type of FIG. 4(a) and slightly inclining the first or parallel side to form the shape of FIG. 4(e).

Apart from the above-mentioned embodiment wherein n-conductivity type impurity atoms are implanted, a modified embodiment may be configured by implanting week p-conductivity type (p⁻) impurity atoms in the regions which are other than the impurity-implanted region 1 and are underneath the horizontal gate 5.

For the aforementioned embodiments, besides the impurity implanting method, thermal diffusion method or the like may be used to make the n-conductivity regions 271, 272, 281, 282, 1, 1', 1".

Since the tapered impurity-implanted region 1, which changes its width along the position in charge transfer direction (Y), is provided in the first HCCD 27, desirable potential gradient is formed from the first HCCD 27 to the transfer gate 29. Therefore, charge transfer becomes easy, and efficiency of charge transfer from the first HCCD 27 to the region of the transfer gate 29 increases. The potential gradient also makes charges transfer easy in the final transfer direction X towards the FD 30.

Besides, the transfer path defined between two isolation regions is shaped to expand its width from the first HCCD 27 toward the second HCCD 28, this also helps to form a desirable potential gradient to smoothly transfer the charge from the first HCCD 27 to the second HCCD 28. That is, by intentionally forming parts to produce a narrow channel effect under the transfer gate 29, the potential gradation is formed in the part under the transfer gate region, which hitherto has flat potential distribution. As a result, improvements in the charge transfer efficiency and transfer speed are obtainable.

Furthermore, according to the manufacturing method of the present invention, even if some misregistration of mask would arise and the impurity implanted region would shift from the designed position, the above-mentioned characteristics can be maintained, and there is almost no influence in the charge transfer.

FIG. 5(a) through FIG. 5(l) show a modified embodiment of the charge transfer device. This embodiment is to be used in the region where the narrow-channel effect appears. In this embodiment, too, the impurity-implanted region 1 is formed by a method similar to the aforementioned embodiments. Since impurity-implanted region 1 is provided, charge transfer in the first HCCD 27 to the second HCCD 28 under transfer gate 29 is carried out smoothly.

Figure 5A:
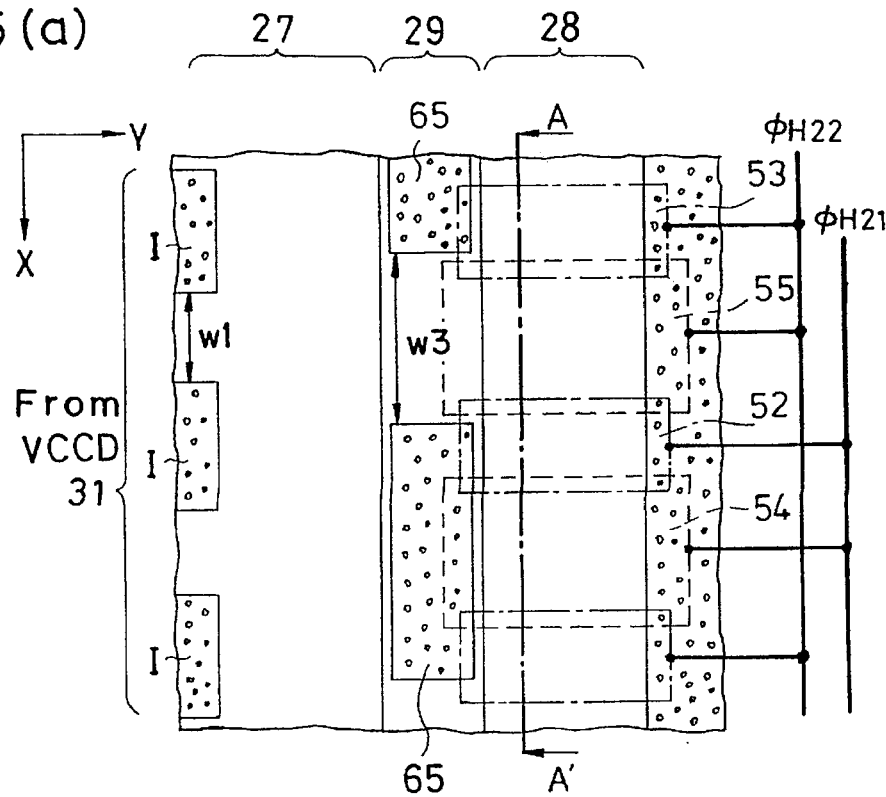
FIG. 5(a) and FIG. 5(b) are plan views showing a modified example of the charge transfer device.
Figure 5B:
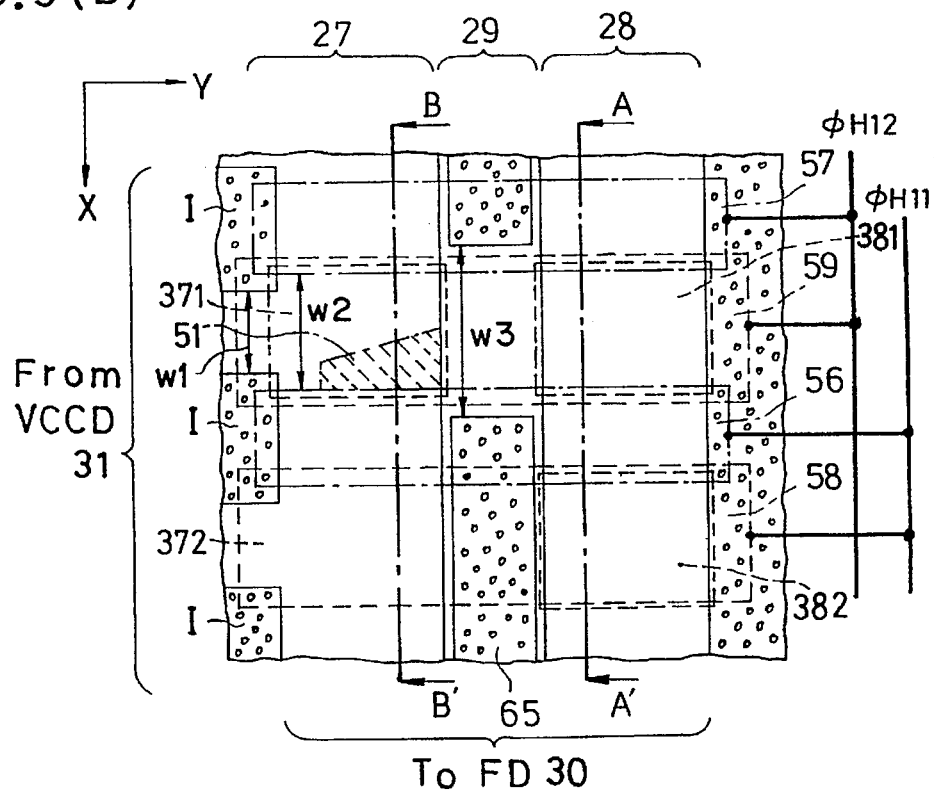
Figure 5C:
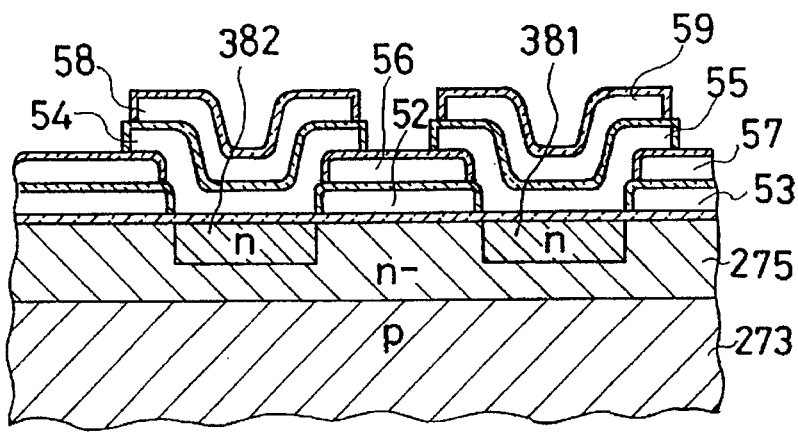
FIG. 5(c), FIG. 5(d), FIG. 5(e) and FIG. 5(f) are sectional views showing sectional configuration of the device shown in FIG. 5(a) and FIG. 5 (b).
Figure 5D:
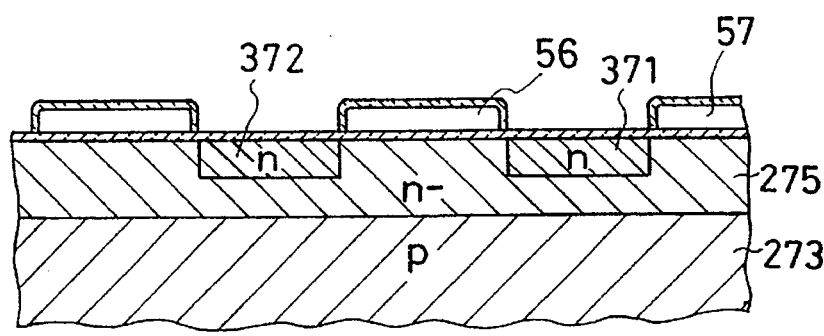
Figure 5E:
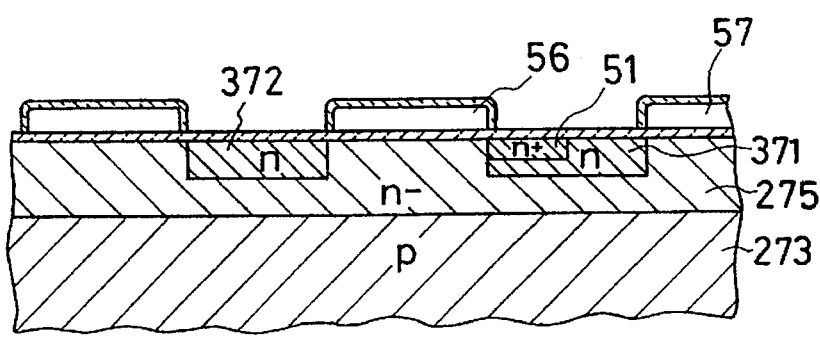
Figure 5F:
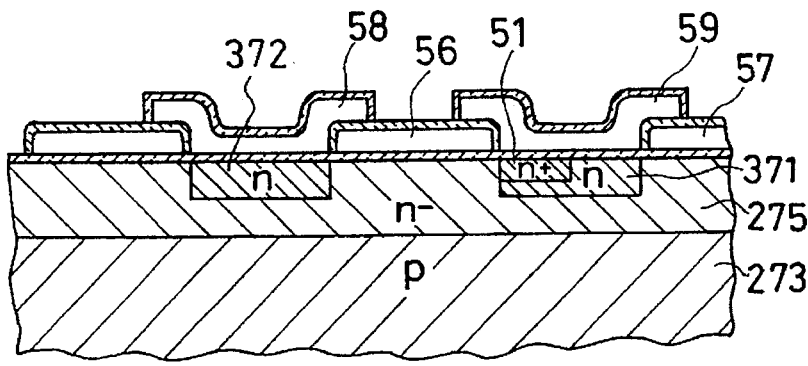

FIG. 5(a) and FIG. 5(b) are plan views dividingly showing respective parts of the device which are actually forming an integral body, but are shown by dividing in two drawings FIG. 5(a) and FIG. 5(b) for elucidation. The transfer gate 29 is formed in the first polysilicon layer, similarly to the aforementioned embodiment.

As shown in FIG. 5(a) and FIG. 5(b), horizontal gates 52 and 53 in the second HCCD 28 is formed by the second polysilicon layer, and the horizontal gates 56 and 57 are formed by the third polysilicon layer. Horizontal gates 52, 53, 56 and 57 are connected to the driving signal lines øH21, øH22, øH11 and øH12. Furthermore, the horizontal gates 54 and 55 are formed by the fourth polysilicon layer and the horizontal gates 58 and 59 are formed by the fifth polysilicon layer. The horizontal gates 54, 55, 57 and 59 are connected to the driving signal lines øH21, øH22, øH12 and øH11.

Although the horizontal gates 56 through 59 are provided on the HCCD 27 and 28, their influence on HCCD 28 is very little, because the second HCCD 28 is covered by the second and fourth polysilicon layers. That is, the second HCCD 28 is driven by the horizontal gates 52 through 55, and the first HCCD 27 is driven by the horizontal gates 56 through 59.

Since the n-conductivity type impurity is implanted by using the first, second and third polysilicon layers as a mask and the impurity is emitted on the whole of the HCCD, the impurity is implanted actually only in the regions underneath the horizontal gates 54, 55, 58 and 59.

Thereafter, the impurity is implanted to the impurity-implanted region 1. This order can, however, be inversed.

Figure 5G:
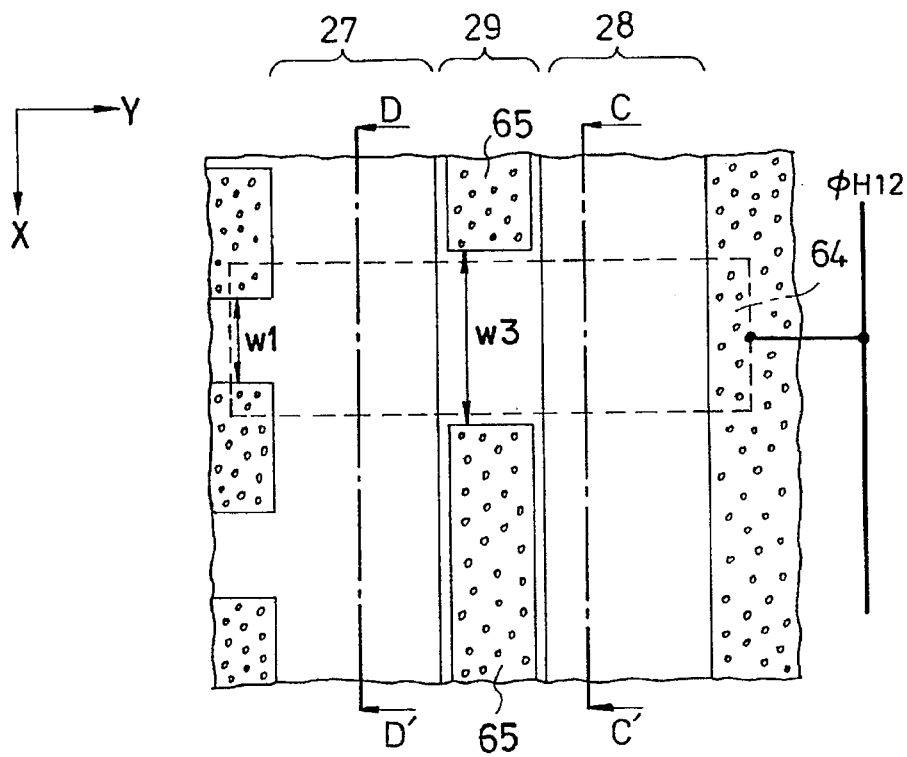
FIG. 5(g) and FIG. 5(h) are plan views showing another modified example of the charge transfer device.
Figure 5H:
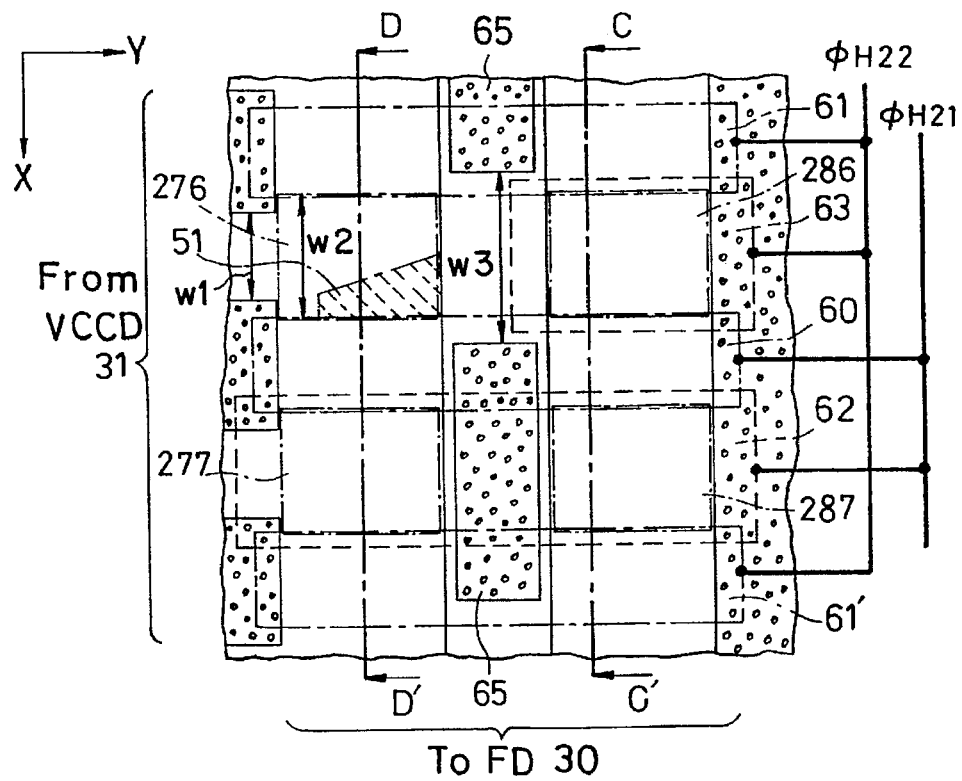
Figure 6:
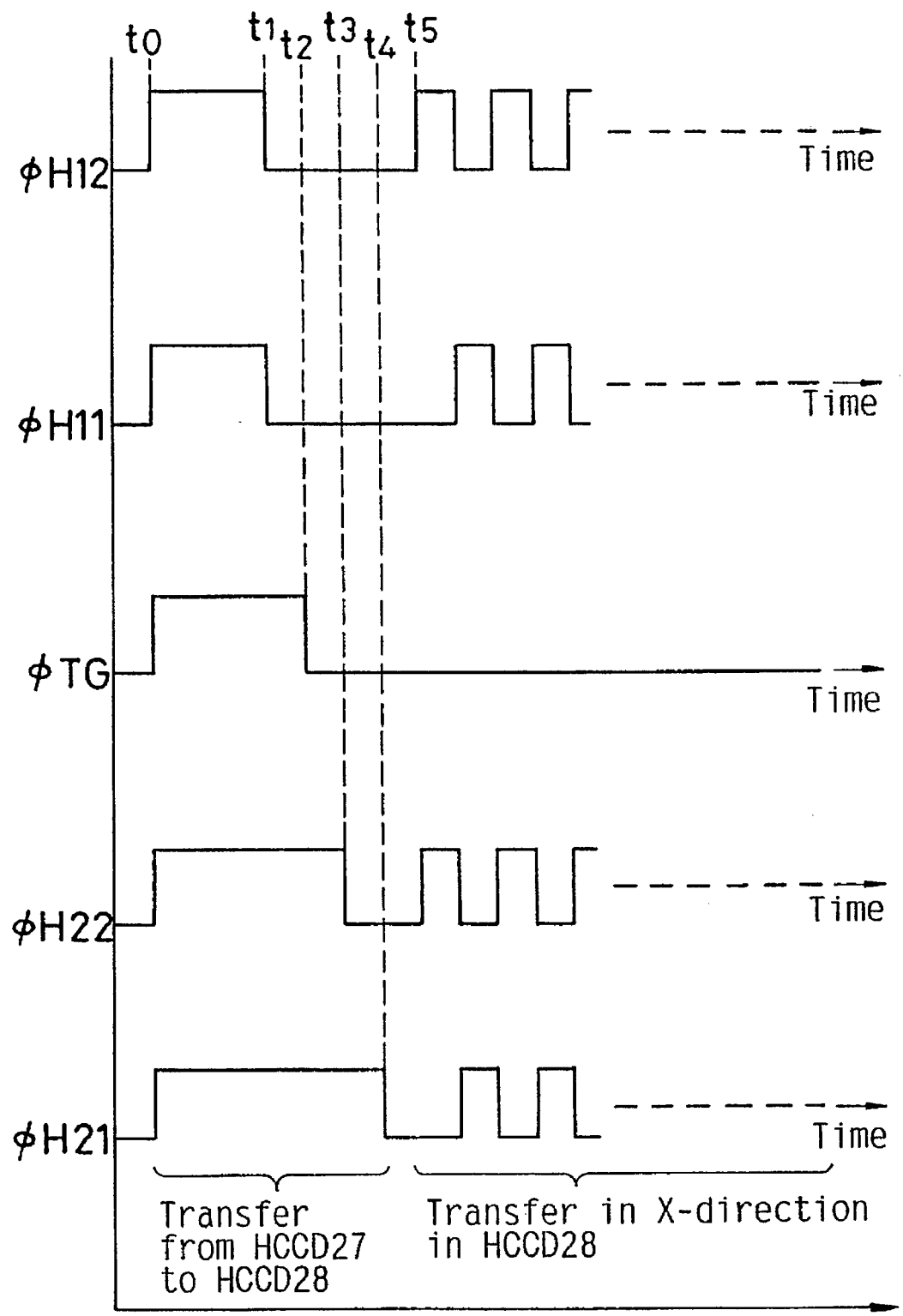
FIG. 6 is a time chart showing operation signals of the example devices shown in FIG. 1(a) through FIG. 5(l).

FIG. 6 is a time chart showing driving pulses of the charge transfer device shown by the above-mentioned figures FIG. 5(a) through FIG. 5(l). When the charge is sent from the VCCD 31 which lies in the left outside of FIG. 5(a), FIG. 5(b), FIG. 5(g) and FIG. 5(h), as shown in FIG. 6, at the point of time T=t0 all the signal pulses at various signal lines øH12, øH11, øTG, øH22 and øH21 become ON state. The charges which are transferred under the horizontal gate 58 (FIG. 5(b)) remain in the parts in the HCCD 28 being obstructed by the isolation region 65 provided there. However, the charge transferred under the horizontal gate 59 is transferred under the transfer gate 29 and to the region under the HCCD 28 because they and the horizontal gate 55 are in the ON state.

At the time T=t1, the signals øH12 and øH11 turn OFF, and the charges under the horizontal gate 59 are all transferred to the parts under the transfer gate 29 and the horizontal gate 55. And then at time T=t3, the signal øH22 turns OFF, and the charge is transferred to the part under the horizontal gate 54. Then, at time T=t4, the signal øH21 becomes OFF and the motion of charge from the first HCCD 27 to the second HCCD 28 is completed.

Thereafter, from the time T=t5, the charge is transferred in the X-direction in the HCCDs' towards the FD30. In the time period of HCCD transferring, the signals become øH12=øH22 and øH11=øH21.

The feature of this embodiment is that the width in the Y-direction is shortened. That is, since both sides of the transfer gate 29 are not inclined, the condition for the width in the Y-direction of the isolation region 65 is only that the first HCCD 27 and the second HCCD 28 do not pass through each other. Hence, the width can be much shortened. Due to the impurity implanted region 51 and the shortening of the isolation region 65, the transfer efficiency from the first HCCD 27 to the second HCCD 28 is improved.

Still another embodiment is elucidated with reference to drawings FIG. 5(g) and FIG. 5(h) which show plan view configurations of complicated structure by dividing the plan view into two plan views of FIG. 5(g) and FIG. 5(h). And FIG. 5(i) is a sectional elevation view taken at the sectional plain C–C'.

FIG. 5(J), FIG. 5(k) and FIG. 5(l) are sectional elevation views illustrating the manufacturing process with respect to a sectional plain D–D' shown in FIG. 5(g) and FIG. 5(h).

In FIG. 5(g) through FIG. 5(l), transfer gate 29 is made by the first polysilicon layer, the horizontal gates 60 and 61 are made by the second polysilicon layer, the horizontal gates 62 and 63 are made by the third polysilicon layer. The horizontal gates 60, 61, 62 and 63 extend from the first HCCD 27 to the second HCCD 28. A horizontal gate 64 is formed by the fourth polysilicon layer. This embodiment has a technical advantage of easy manufacturing since the number of polysilicon layers is less by one in comparison with the previous embodiment.

Implantation of n-conductivity type impurity atoms is made by emitting the impurity atoms on the whole area of the HCCDs' 27 and 28 by utilizing the first polysilicon layer and the second polysilicon layer as masks, and the impurity atoms are implanted only to the parts under the horizontal gates 62, 63 and 64. Thereafter, n-conductivity type atoms are implanted again to the impurity-implanted region 51. The order of the impurity implantation may be inversed. The operation of the device of this embodiment is substantially the same as that of the previous embodiment. Therefore, the operation is elucidated briefly as follows. First, the charge is transferred from VCCD 31 from the left outside, and the charge sent under the horizontal gate 62 is retained as it is, owing to the provision of the isolation region 65 until the next transfer in the HCCD toward the FD 30.

The charge transferred to the part under the HCCD 27 is passed to the second HCCD 28 because the horizontal gate 64 and the transfer gate 29 are switched OFF in turn. The signal at the signal lines becomes øH22=øH12 in the transfer through the HCCDs'. In this embodiment, as in the previous embodiment, the width in the Y-direction can be reduced and the transfer efficiency improved.

Figure 7A:
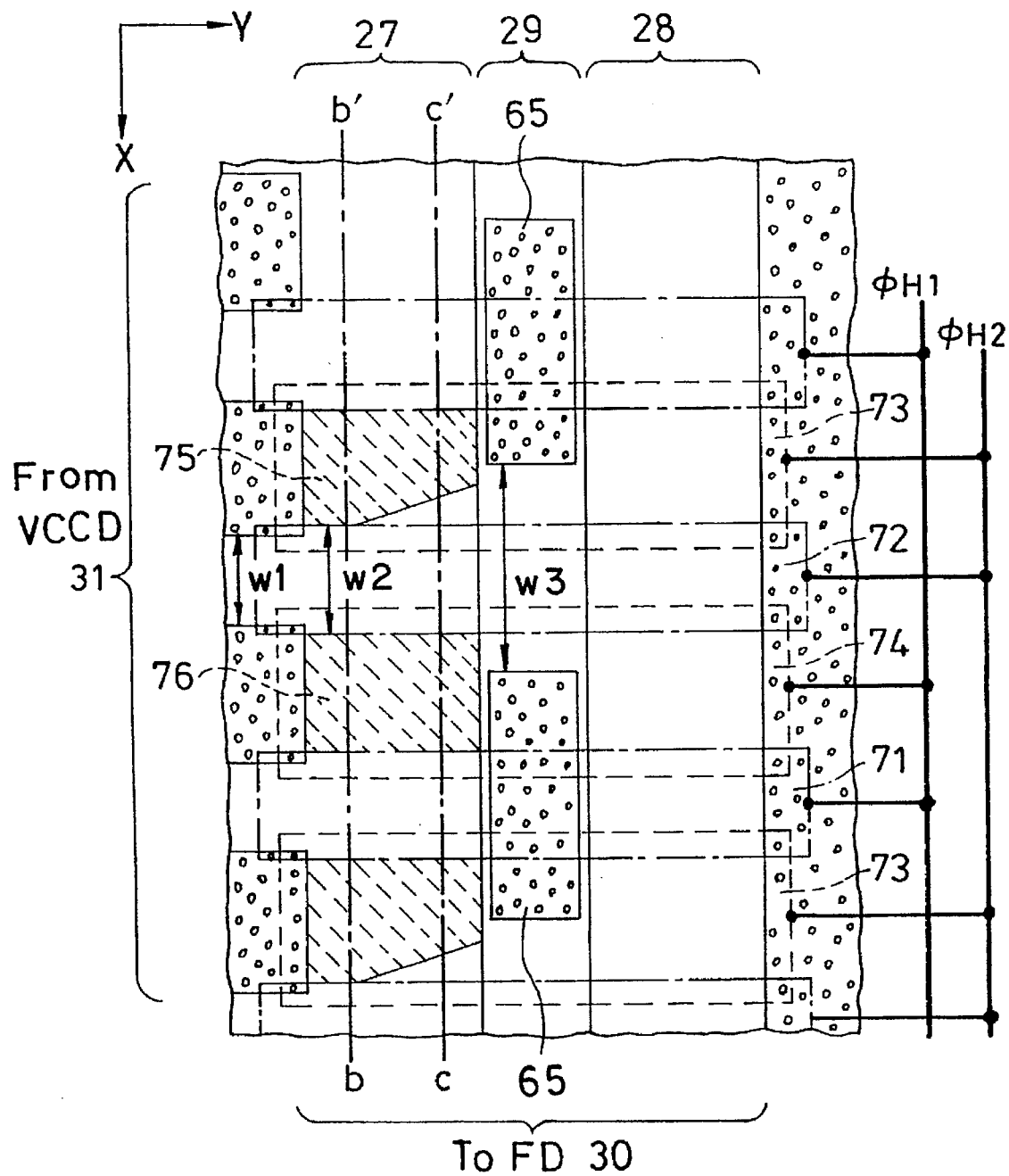
FIG. 7(a) is a plan views showing a still further modified example of the charge transfer device.
Figure 7B:
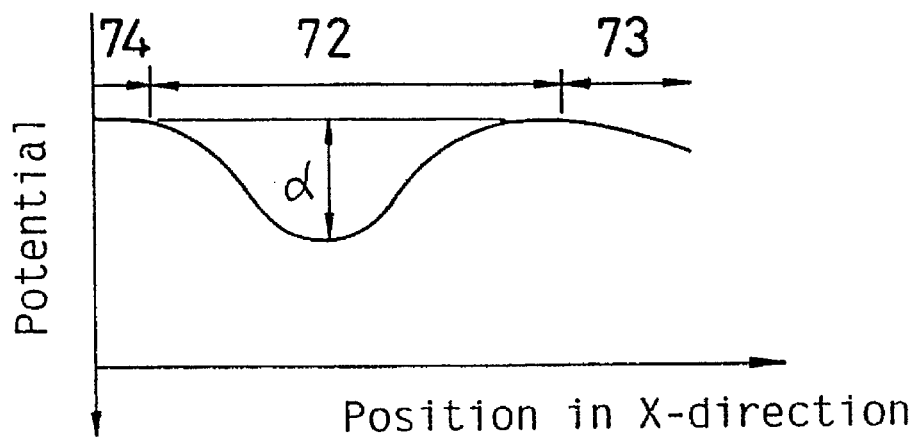
FIG. 7(b) and FIG. 7(c) are potential distribution graphs of the device of FIG. 7(a).
Figure 7C:
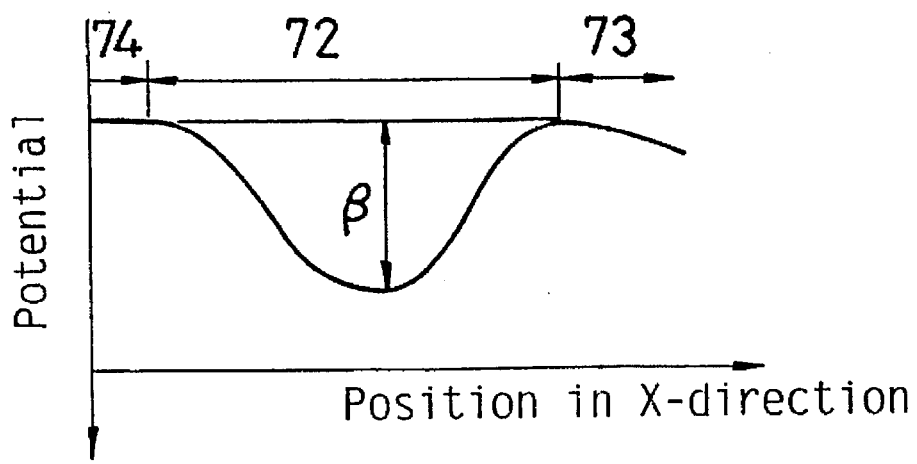

FIG. 7(a) is an enlarged planar view of a charge transfer device of another embodiment. FIG. 7(b) and FIG. 7(c) are potential distribution profiles of the embodiment of FIG. 7(a). The transfer gate 29 is made by the first polysilicon layer. Horizontal gates 71 and 72 are made by the second polysilicon layer. Horizontal gates 73 and 74 are formed by the third polysilicon layer. After forming the second polysilicon layer, the impurity is implanted to the impurity-implanted regions 75 and 76 thereby to make a barrier. This impurity implantation is made by implanting p-conductivity impurity atoms. Impurity implantation is made also under the horizontal gates 73 and 74 of the HCCD 28 to form impurity-implanted region 76. Since any impurity that is implanted is masked by the horizontal gates 71, 72 and transfer gate 29, it is not implanted in the triangular part under the horizontal gate 73, and hence the potential of this part is the same as the part under the horizontal gate 72. FIG. 7(b) and FIG. 7(c) show potential distribution profiles at the sectional plane b–b' and c–c' shown on FIG. 7(a). As shown in FIG. 7(b), the potential depth α is low while in FIG. 7(c) the potential depth β is higher. Therefore, the hitherto-problematic potential recess does not arise in the embodiment, and charge transfer toward the HCCD 28 is smooth.

With regard to the horizontal gate 71, there is no need to move the charge toward the HCCD 28 since the impurity-implanted region 76 has been formed in rectangular shape. However, the region 76 may be formed in the same shape as that of the region 75. Further, with regard to HCCD 28, the impurity-implanted regions may be shaped in the same shape as the impurity-implanted region 75.

Figure 8A:
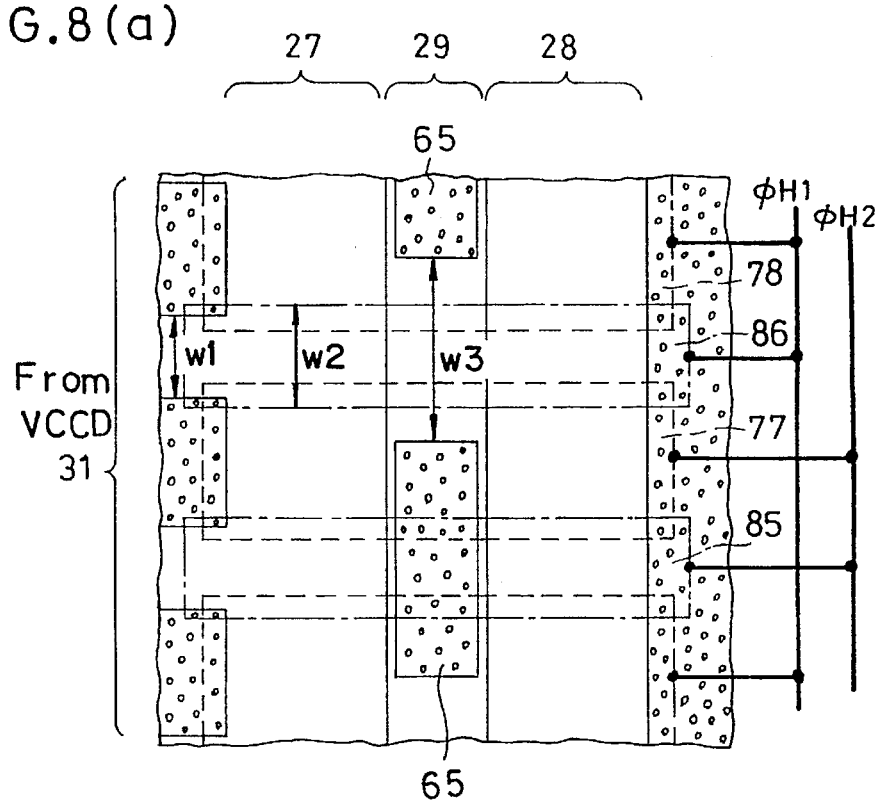
FIG. 8(a) and FIG. 8(b) are plan views showing yet another modified example of the charge transfer device.
Figure 8B:
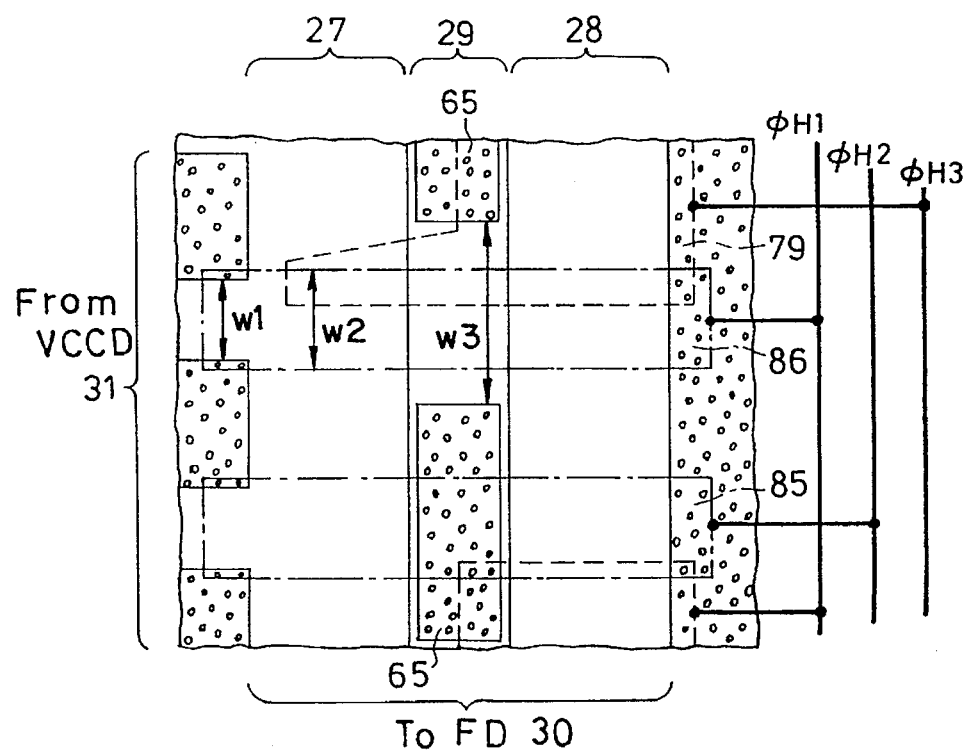

FIG. 8(a) and FIG. 8(b) are enlarged divided planar views showing still another embodiment of a charge transfer device which are divided for illustration of a complicated structure. In the embodiment of FIG. 8(a) and FIG. 8(b), the horizontal gates 85 and 86 are made by the second polysilicon layer, the horizontal gate 79 is made by the third polysilicon layer, the horizontal gates 77 and 78 are made by the fourth polysilicon layer. The transfer gate 79 of FIG. 8(b) is shaped to have an inclined side from the first HCCD 27 to the part of the transfer gate 29. Although not shown in FIG. 8(a) and FIG. 8(b), after forming the third polysilicon layer, p-conductivity type impurity atoms are implanted by self-alignment.

In the charge transfer from the VCCD 31 to the first HCCD 27, the signal lines øH1, øH2 and øH3 and the transfer gate 29 are made ON state, and when transferring from the EICCD 27 to the part under the transfer gate 29 the signals øH1 and øH3 are made OFF state. That is, the horizontal gates 86 and 79 make the same operation, and work as a single gate. In the X-direction transfer towards FD 30 by HCCD transferring, the signal line is driven as øH1=øH3. As a result, the horizontal gate 86 in the part of EICCD 27 can be considered as a gate extending towards the transfer gate 29 (by means of the effect of the transfer gate 79), and therefore the charge transfer becomes smooth. Furthermore, by realizing the shape of the horizontal gate 79 from the HCCD 27 to the transfer gate 29 also in the HCCD 28, the charge transfer efficiency from the transfer gate 29 is improved.

Figure 8C:
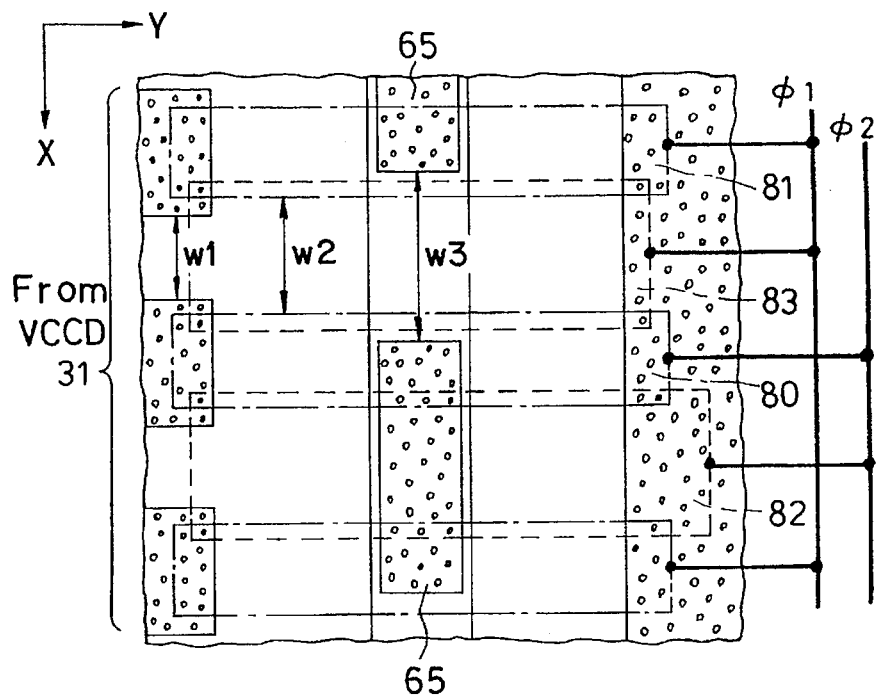
FIG. 8(c) and FIG. 8(d) are plan views showing a further example of the device.
Figure 8D:
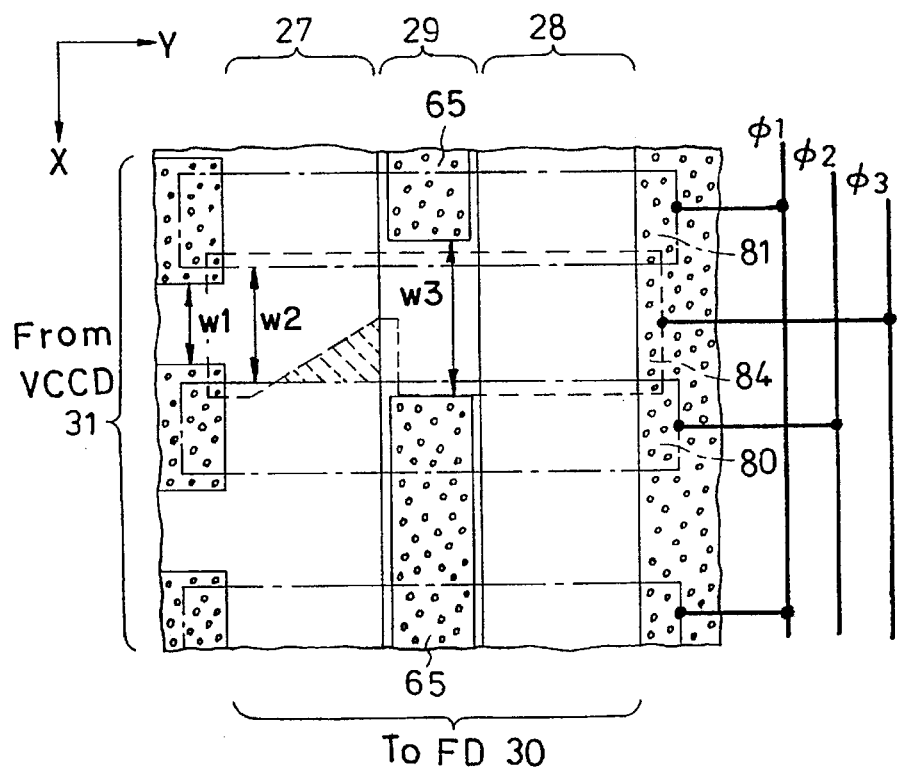

FIG. 8(c) and FIG. 8(d) are enlarged divided plan views showing still another charge transfer device which is divided for illustration of a complicated structure. Transfer gate 29 is made by the first polysilicon layer, the horizontal gates 80 and 81 are made by the second polysilicon layer. The horizontal gate 84 is made by the third polysilicon layer. The horizontal gates 82 and 83 are made by the fourth polysilicon layer. When the charge transfer is made from the VCCD 31 to the part under the transfer gate 29, the signal lines øH1, øH2 and øH3 and the transfer gate 29 are made ON state. When the transfer is made from the EICCD 27 to the part under the transfer gate 29, the signal lines øH1 and øH3 are made OFF state. N-conductivity type impurity is implanted after forming the second and fourth polysilicon layers, and subsequently, after forming the third polysilicon layer, the impurity is again implanted to the hatched part of FIG. 8(d) by a self-alignment method. As a result, a configuration of the ion-implanted hatched region extending from the HCCD 27 towards the transfer gate 29 is realized, and therefore the transfer efficiency is improved. As in the previous embodiment, with regard to the horizontal gate 84, by repeating the similar shape to that from HCCD 27 to the transfer gate 29 also on the transfer gate 29, the transfer efficiency is improved. Furthermore, by realizing the shape of the transfer gate from the HCCD 27 to the HCCD 29 also in the HCCD 28, the charge transfer efficiency from the transfer gate 29 is improved. Further, similar effect is obtainable by making a transfer gate which covers the hatched part of FIG. 8(d) and making p-conductivity type impurity implantation into the HCCD 27, except in the hatched part (which corresponds to the horizontal gate 84).

With regard to this embodiment and previous embodiments, a similar effect is obtainable even when connecting the signal lines øH1 and øH2.

In the above-mentioned three embodiments, when the isolation region as shown in the first embodiment and the trapezoidal, triangular or paraboloidal ion-implanted region 1 shown in FIG. 1(c) is combined in the abovementioned three embodiments, there is no serious problem of inverse flow of charge in the charge transfer towards the HCCD 28.

Figure 9A:
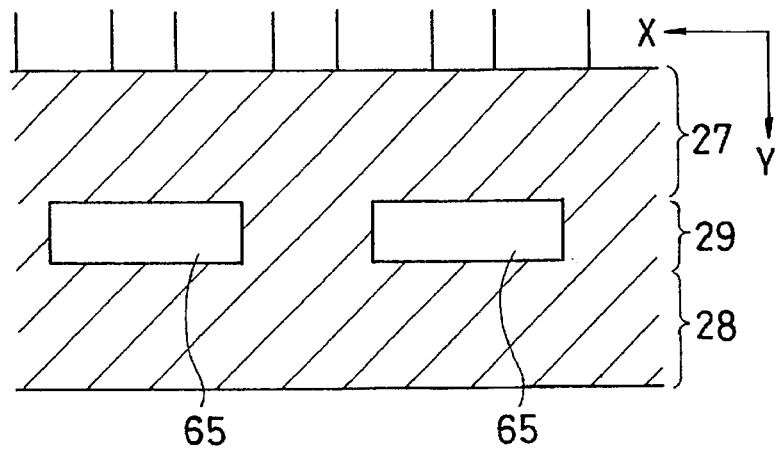
FIG. 9(a) is a plan view showing the steps of forming isolation region (65) shown in FIG. 8(a) through FIG. 8(d).
Figure 9B:
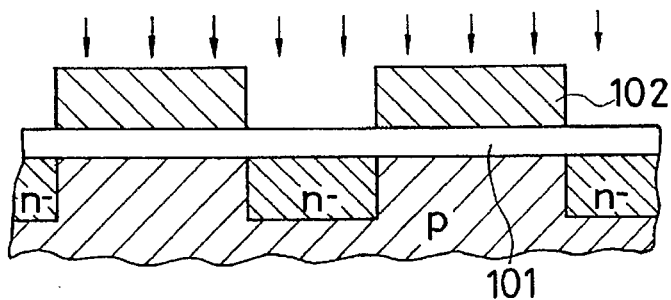
FIG. 9(b), FIG. 9(c), FIG. 9(d) and FIG. 9(e) are sectional views illustrating the making steps of forming isolation region (65) shown in FIG. 9(a).
Figure 9C:
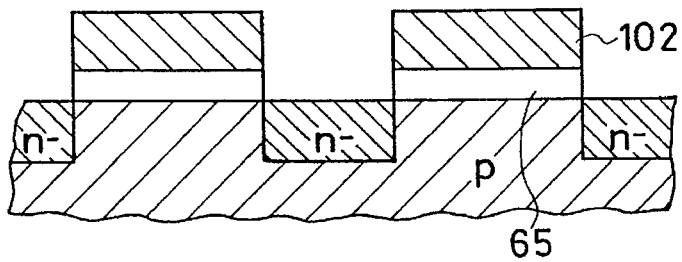
Figure 9D:
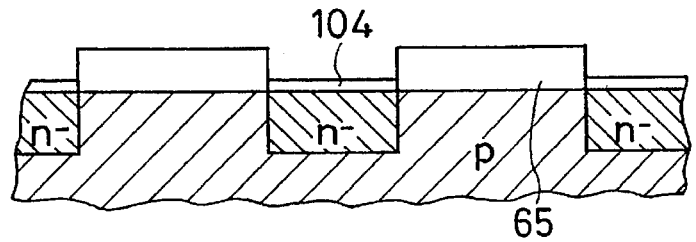
Figure 9E:
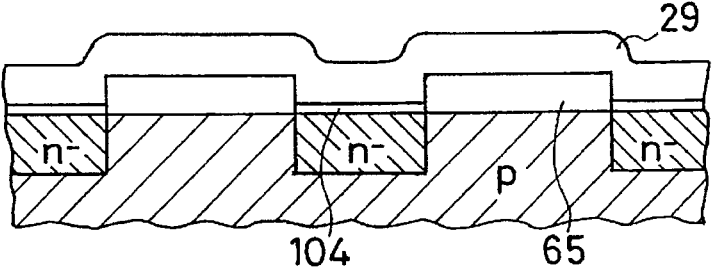
Figure 13A:
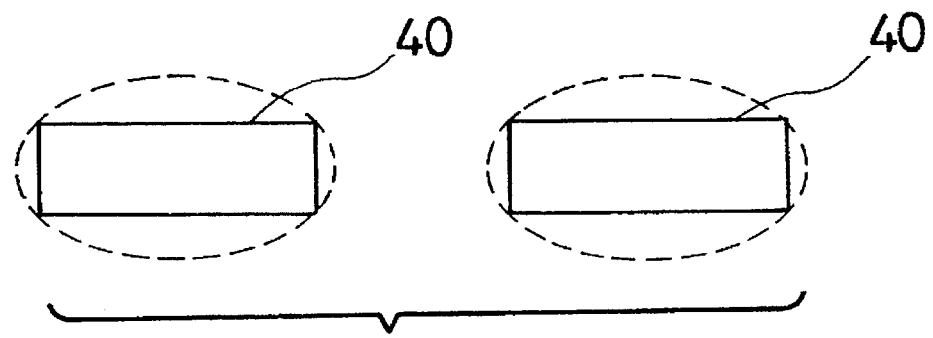
FIG. 13(a) and FIG. 13(b) are the plan views showing actual diffusion of the isolation regions.
Figure 13B:
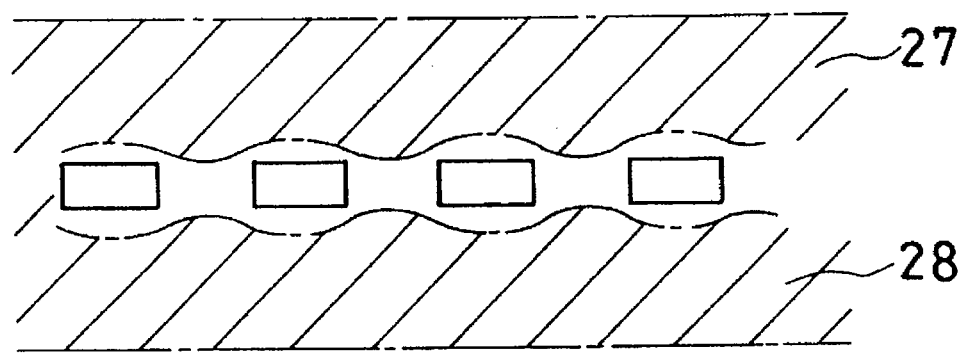

FIG. 9(a)–9(e) are a plan view for forming the isolation regions and buried channels. The CCD is in general made by forming buried channels, and actually, is formed by implanting n-conductivity type impurity atoms into the regions indicated by hatching in FIG. 9(a). In this embodiment, as shown in the sectional elevation view of FIG. 9(b), on a passivating oxide film 101 a photo-resist 102 is formed at the part to correspond to the isolation region 65. In this state, ion-implantation is carried out, and then the impurity implantation is made only in the part which is not covered by the photo-resist 102. Thereafter, as shown in FIG. 9(c), the oxide film 65 exposed from the photo-resist mask 102 is etched, and then an oxide film is grown again to a depth which is smaller than the earlier made oxide film as shown in FIG. 9(d). Subsequently, the transfer gate 29 is made by the first polysilicon layer on both of the thicker oxide film 65 and thinner oxide film 104. Thereby, a configuration that the transfer gate 29 covers the thicker oxide film 65 and the thinner oxide film 104. Therefore, when a voltage is applied to the transfer gate 29, the potential on the two different thickness regions to each other is different. When the HCCD is running, the transfer gate 29 is applied by a negative potential thereby to make it in complete OFF state. In such a case, to some extent the applied potential is applied to the oxide film and the balance of potential is applied to the surface of the semiconductor under the oxide film. Therefore, the depletion layer extends to the extent depending on the thickness of the oxide film, and potential thereof also depends on the thickness. And the change of the potential corresponding to the applied voltage varies greater as the thickness of the oxide film is thinner. This means that in the case of FIG. 13(b), when the negative voltage applied to the gate is increased, some part of EICCD region is effectively lost at the part where the oxide film is thin. When compared with the original state, for instance application voltage is zero. The above-mentioned effect appears and the meandering of the equipotential line is improved by increasing the negative applied voltage. As a result, charge transfer towards FD 30 (in the X-direction) becomes smooth, and transfer efficiency is improved.

As has been described, according to the present embodiment the width of the isolation region 65 in the Y-direction becomes short, and hence transfer loss in the isolation region 65 is decreased. Furthermore, in a modified version of the preferred embodiment, there is provided in the HCCD, a region of a continuously changing depletion layer along the impurity implanted region or in the polysilicon gate. Therefore, by way of a narrowchannel effect, a potential gradation is produced from the part of an HCCD towards the transfer gate or where an isolation region is produced, and therefore charge transfer becomes easy, and thereby charge transfer efficiency is much improved. In addition, the above-mentioned configuration induces a potential gradient which is helpful in easy charge motion in the transfer direction of HCCD (in the X-direction). That is, by intentionally producing the part to form a narrow channel effect, a desirable Potential gradient in the direction of charge transfer is produced at a position where the potential distribution has hitherto been flat. As a result of the above-mentioned, the embodiment has drastically improved charge transfer efficiency and increase of transfer speed. Furthermore, according to the manufacturing method of the present invention, even though the isolation region is widened the meandering of the potential in transfer direction (X) of the HCCD can be reduced, and therefore the transfer efficiency is improved.

As has been described, according to the present invention in the charge transfer device comprising plural HCCDs, the charge transfer between HCCDs can be made smooth by means of rather simple configurations, and thereby, fixed pattern noise induced mainly by transfer loss is minimized drastically. Such improvement is achieved by the utilization of the narrow-channel effect, and therefore high quality picture can be produced even through a higher density of integration of the CCD to be realized in the future. Furthermore, according to the configuration of the present invention, the potential meandering in the direction of HCCD transfer (X-direction), which is inevitable in the actual manufacture, can be drastically reduced, and thereby the transfer efficiency is increased and good quality picture is realizable.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A charge transfer device comprising:
   plural vertical charge-coupled devices each having a channel width w1;
   plural horizontal charge-coupled devices disposed in parallel;
   plural isolation regions disposed under a transfer gate part which is disposed between said plural horizontal charge-coupled devices, wherein adjacent-most portions of said plural isolation regions define a channel having a channel width w3, wherein said channel width w3 is larger than said channel width w1 between adjacent two of said plural isolation regions; and
   impurity implanted regions including first impurity-implanted regions each having a first edge portion and a second edge portion defining said first impurity-implanted region therebetween such that no impurities of a type defining said first impurity-implanted regions are located outside said first and said second edge portions, said first impurity-implanted regions having a width w2 extending between said first and said second edge portions of said first impurity implanted region in a direction generally perpendicular to a vertical direction of charge transfer, said width w2 being larger than said channel width w1 and smaller than said channel width w3 throughout an entire length of each of said first impurity-implanted regions, said length of each of said first impurity implanted regions being a dimension of said first impurity implanted regions in a direction generally parallel to said vertical direction of charge transfer, and second impurity-implanted regions, said second impurity-implanted regions having at least one side which is oblique to a longitudinal direction of horizontal gates.

2. A charge transfer device in accordance with claim 1, wherein at least one side of each of said second impurity-implanted regions is in contact with each of said first impurity-implanted regions, and each of said second impurity-implanted regions gradually expands its width in a vertical direction of charge transfer.

3. A charge transfer device comprising:
   plural vertical charge-coupled devices each having a channel width w1;
   a first horizontal charge-coupled device having first horizontal gates and second horizontal gates;
   a second horizontal charge-coupled device having third horizontal gates and fourth horizontal gates;
   plural isolation regions for making selective conduction between said first and second horizontal charge-coupled devices, wherein adjacent-most portions of said plural isolation regions define a channel having a channel width w3, wherein said channel width w3 is larger than said channel width w1 between adjacent two of said plural isolation regions;
   a transfer gate located above said isolation regions, said transfer gate being of a first polysilicon layer, said third horizontal gates being of a second polysilicon layer, said first horizontal gates being of a third polysilicon layer, said fourth horizontal gates being of a fourth polysilicon layer and said second horizontal gates being of a fifth polysilicon layer; and
   impurity-implanted regions including first impurity-implanted regions each having a first edge portion and a second edge portion defining said first impurity-implanted region therebetween such that no impurities of a type defining said first impurity-implanted regions are located outside said first and said second edge portions, said first impurity-implanted regions having a width w2 extending between said first and said second edge portions of said first impurity implanted region in a direction generally perpendicular to a vertical direction of charge transfer, said width w2 being larger than said channel width w1 and smaller than said channel width w3 throughout an entire length of each of said first impurity-implanted regions, said length of each of said first impurity implanted regions being a dimension of said first impurity implanted regions in a direction generally parallel to said vertical direction of charge transfer, and second impurity-implanted regions, said second impurity-implanted regions having at least one side which is oblique to a longitudinal direction of each of said horizontal gates of said first and second horizontal charge-coupled devices.

4. A charge transfer device comprising:
   plural vertical charge-coupled devices each having a channel width w1;
   a first horizontal charge-coupled device having first horizontal gates, second horizontal gates, and third horizontal gates;

a second horizontal charge-coupled device having first horizontal gates and second horizontal gates;

plural isolation regions for making selective conduction between said first and second horizontal charge-coupled devices adjacent-most portions of said plural isolation regions defining a channel having a channel width w3, wherein said channel width w3 is larger than said channel width w1 between adjacent two of said plural isolation regions;

a transfer gate located on said isolation regions, said transfer gates being of a first polysilicon layer, said first horizontal gates being of a second polysilicon layer, said second horizontal gates being of a third polysilicon layer and said third horizontal gates being of a fourth polysilicon layer; and impurity-implanted regions including first impurity-implanted regions each having a first edge portion and a second edge portion defining said first impurity-implanted region therebetween such that no impurities of a type defining said first impurity-implanted regions are located outside said first and said second edge portions, said first impurity-implanted regions having a width w2 extending between said first and said second edge portions of said first impurity implanted region in a direction generally perpendicular to a vertical direction of charge transfer, said width w2 being larger than said channel width w1 and smaller than said channel width w3 throughout an entire length of each of said first impurity-implanted regions, said length of each of said first impurity implanted regions being a dimension of said first impurity implanted regions in a direction generally parallel to said vertical direction of charge transfer, and second impurity-implanted regions, said second impurity-implanted regions having at least one side which is oblique to a longitudinal direction of each of said horizontal gates of said first and second horizontal charge-coupled devices.

5. A charge transfer device comprising:

plural vertical charge-coupled devices each having a channel width w1;

first and second horizontal charge-coupled devices each having at least one of first horizontal gates and second horizontal gates and receiving an electric charge from a vertical charge coupled device;

plural isolation regions for making selective conduction between said horizontal charge-coupled devices, adjacent-most portions of said plural isolation regions defining a channel having a channel width w3, wherein said channel width w3 is larger than said channel width w1 between adjacent two of said plural isolation regions;

transfer gates located above said plural isolation regions, said transfer gates being of a first polysilicon layer, said first horizontal gates being of a first polysilicon layer, said first horizontal gates being of a second polysilicon layer, and said second horizontal gates being of a third polysilicon layer; and p-conductivity-impurity-implanted regions having at least one side which is oblique to a longitudinal direction of each of said horizontal gates of said first and second horizontal charge-coupled devices, each of said p-conductivity-impurity-implanted regions defining a gap w2 between edges of adjacent two of said p-conductivity-impurity-implanted regions in a direction generally perpendicular to a vertical direction of charge transfer, said gap w2 being larger than said channel width w1 and smaller than said channel width w3 throughout an entire length of each of said p-conductivity-impurity-implanted regions, said length of each of said p-conductivity-impurity-implanted regions being a dimension of said p-conductivity-impurity-implanted regions in a direction generally parallel to a vertical direction of charge transfer.

6. A charge transfer device comprising:

plural horizontal charge-coupled devices;

plural isolation regions for making selective conduction between said horizontal charge-coupled devices;

an insulation film having large thickness sections disposed above interruption sections of said charge transfer device wherein charge transfer between said horizontal charge-coupled devices is interrupted and smaller thickness sections disposed above conduction sections of said charge transfer device wherein charge transfer between said horizontal charge-coupled devices is enabled; and transfer gates located over entire surfaces of said large thickness sections and smaller thickness sections.

* * * * *